(12) United States Patent
Perkins et al.

(10) Patent No.: US 11,283,394 B2
(45) Date of Patent: Mar. 22, 2022

(54) PHOTOVOLTAIC MODULE WITH TEXTURED SUPERSTRATE PROVIDING SHINGLE-MIMICKING APPEARANCE

(71) Applicant: GAF Energy LLC, Parsippany, NJ (US)

(72) Inventors: Richard Perkins, San Jose, CA (US); Alex Sharenko, Berkeley, CA (US); Thierry Nguyen, San Francisco, CA (US); Gabriela Bunea, San Jose, CA (US); Anna Wojtowicz, San Francisco, CA (US)

(73) Assignee: GAF ENERGY LLC, Parsippany, NJ (US)

( * ) Notice: Subject to any disclaimer, the term of this patent is extended or adjusted under 35 U.S.C. 154(b) by 0 days.

(21) Appl. No.: 17/179,105

(22) Filed: Feb. 18, 2021

(65) Prior Publication Data
US 2021/0257961 A1    Aug. 19, 2021

Related U.S. Application Data

(60) Provisional application No. 62/977,863, filed on Feb. 18, 2020.

(51) Int. Cl.
*H02S 20/25*    (2014.01)
*H01L 31/048*    (2014.01)
(Continued)

(52) U.S. Cl.
CPC .............. *H02S 20/25* (2014.12); *B32B 3/266* (2013.01); *B32B 7/12* (2013.01); *B32B 17/10* (2013.01);
(Continued)

(58) Field of Classification Search
CPC .......... H02S 20/25; B32B 3/266; B32B 7/12; B32B 17/10; B32B 2419/06;
(Continued)

(56) References Cited

U.S. PATENT DOCUMENTS

| 4,636,577 A | 1/1987 | Peterpaul |
| 5,642,596 A | 7/1997 | Waddington |

(Continued)

FOREIGN PATENT DOCUMENTS

| CA | 2829440 A1 | 4/2014 |
| CH | 700095 A2 | 6/2010 |

(Continued)

OTHER PUBLICATIONS

Sunflare, Procducts: "Sunflare Develops Prototype for New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Nathan L Van Sell
(74) *Attorney, Agent, or Firm* — Greenberg Traurig, LLP

(57) ABSTRACT

A system including a solar module installed on a roof deck, including a superstrate layer, an encapsulant having an upper layer and a lower layer, and a photovoltaic layer intermediate the upper layer and the lower layer of the encapsulant. An upper surface of the superstrate layer includes an indentation pattern. The indentation pattern includes a mesh of indentations indented into the upper surface of the superstrate layer and a plurality of openings defined by the mesh of indentations.

7 Claims, 9 Drawing Sheets

(51) Int. Cl.
*E04D 1/30* (2006.01)
*E04D 1/28* (2006.01)
*B32B 17/10* (2006.01)
*B32B 3/26* (2006.01)
*B32B 7/12* (2006.01)

(52) U.S. Cl.
CPC ............... *E04D 1/28* (2013.01); *E04D 1/30* (2013.01); *H01L 31/048* (2013.01); *B32B 2419/06* (2013.01); *B32B 2457/12* (2013.01); *E04D 2001/308* (2013.01)

(58) Field of Classification Search
CPC ......... B32B 2457/12; E04D 1/30; E04D 1/28; E04D 2001/308; H01L 31/048
See application file for complete search history.

(56) References Cited

U.S. PATENT DOCUMENTS

| | | | |
|---|---|---|---|
| 6,008,450 A | 12/1999 | Ohtsuka et al. | |
| 6,341,454 B1 | 1/2002 | Koleoglou | |
| 6,928,781 B2 | 8/2005 | Desbois et al. | |
| 7,155,870 B2 | 1/2007 | Almy | |
| 7,487,771 B1 | 2/2009 | Eiffert et al. | |
| 7,587,864 B2 | 9/2009 | McCaskill et al. | |
| 7,666,491 B2 | 2/2010 | Yang et al. | |
| 7,678,990 B2 | 3/2010 | McCaskill et al. | |
| 7,678,991 B2 | 3/2010 | McCaskill et al. | |
| 7,748,191 B2 | 7/2010 | Podirsky | |
| 7,819,114 B2 | 10/2010 | Augenbraun et al. | |
| 7,824,191 B1 | 11/2010 | Browder | |
| 7,832,176 B2 | 11/2010 | McCaskill et al. | |
| 8,210,570 B1 | 7/2012 | Railkar et al. | |
| 8,371,076 B2 | 2/2013 | Jones et al. | |
| 8,468,754 B2 | 6/2013 | Railkar et al. | |
| 8,505,249 B2 | 8/2013 | Geary | |
| 8,512,866 B2 | 8/2013 | Taylor | |
| 8,623,499 B2 | 1/2014 | Viasnoff | |
| 8,713,860 B2 | 5/2014 | Railkar et al. | |
| 8,925,262 B2 | 1/2015 | Railkar et al. | |
| 8,946,544 B2 | 2/2015 | Jacobs et al. | |
| 8,994,224 B2 | 3/2015 | Mehta et al. | |
| 9,145,498 B2 | 9/2015 | Ultsch | |
| 9,169,646 B2 | 10/2015 | Rodrigues et al. | |
| 9,171,991 B2 | 10/2015 | Pearce | |
| 9,273,885 B2 | 3/2016 | Rodrigues et al. | |
| 9,359,014 B1 | 6/2016 | Yang et al. | |
| 9,605,432 B1 | 3/2017 | Robbins | |
| 9,670,353 B2 | 6/2017 | Peng et al. | |
| 9,711,672 B2 | 7/2017 | Wang | |
| 9,711,991 B2 | 7/2017 | Hall et al. | |
| 9,831,818 B2 | 11/2017 | West | |
| 9,912,284 B2 | 3/2018 | Svec | |
| 9,920,515 B2 | 3/2018 | Xing et al. | |
| 9,923,515 B2 | 3/2018 | Rodrigues et al. | |
| 9,987,786 B2 | 6/2018 | Stoiljkovic et al. | |
| 9,991,412 B2 | 6/2018 | Gonzalez et al. | |
| 10,015,933 B2 | 7/2018 | Boldrin | |
| 10,027,273 B2 | 7/2018 | West et al. | |
| 10,115,850 B2 | 10/2018 | Rodrigues et al. | |
| 10,179,852 B2 | 1/2019 | Gossi et al. | |
| 10,187,005 B2 | 1/2019 | Rodrigues et al. | |
| 10,256,765 B2 | 4/2019 | Rodrigues et al. | |
| 10,480,192 B2 | 11/2019 | Xing et al. | |
| D879,031 S | 3/2020 | Lance et al. | |
| 10,669,414 B2 | 6/2020 | Li et al. | |
| D904,289 S | 12/2020 | Lance et al. | |
| 10,907,355 B2 | 2/2021 | Hubbard et al. | |
| 10,914,063 B2 | 2/2021 | Lee et al. | |
| RE48,555 E | 5/2021 | Cancio et al. | |
| 11,015,085 B2 | 5/2021 | Bruns et al. | |
| 11,065,849 B2 | 7/2021 | Ackermann et al. | |
| 2002/0102422 A1 | 8/2002 | Hubbard et al. | |
| 2003/0217768 A1 | 11/2003 | Guha | |
| 2006/0042683 A1 | 3/2006 | Gangemi | |
| 2007/0181174 A1 | 8/2007 | Ressler | |
| 2007/0240754 A1 | 10/2007 | Gayout et al. | |
| 2008/0035140 A1 | 2/2008 | Placer et al. | |
| 2008/0315061 A1 | 2/2008 | Placer et al. | |
| 2009/0019795 A1 | 1/2009 | Szacsvay et al. | |
| 2009/0044850 A1 | 2/2009 | Kimberley | |
| 2009/0114261 A1 | 5/2009 | Stancel et al. | |
| 2009/0159118 A1 | 6/2009 | Kalkanoglu et al. | |
| 2010/0101634 A1 | 4/2010 | Frank et al. | |
| 2011/0030761 A1 | 2/2011 | Kalkanoglu et al. | |
| 2011/0036386 A1 | 2/2011 | Browder | |
| 2011/0048507 A1 | 3/2011 | Livsey et al. | |
| 2011/0058337 A1 | 3/2011 | Han et al. | |
| 2011/0132427 A1 | 6/2011 | Kalkanoglu et al. | |
| 2011/0239555 A1 | 10/2011 | Cook et al. | |
| 2011/0302859 A1 | 12/2011 | Crasnianski | |
| 2012/0060902 A1 | 3/2012 | Drake | |
| 2012/0176077 A1 | 7/2012 | Oh et al. | |
| 2012/0212065 A1 | 8/2012 | Cheng et al. | |
| 2012/0233940 A1 | 9/2012 | Perkins et al. | |
| 2012/0240490 A1 | 9/2012 | Gangemi | |
| 2012/0260977 A1 | 10/2012 | Stancel | |
| 2013/0014455 A1 | 1/2013 | Grieco | |
| 2013/0167911 A1 | 7/2013 | Ikenaga et al. | |
| 2014/0150843 A1* | 6/2014 | Pearce ............... H01L 31/02 136/244 |
| 2015/0024159 A1 | 1/2015 | Bess et al. | |
| 2016/0359451 A1 | 12/2016 | Mao et al. | |
| 2017/0159292 A1 | 6/2017 | Chihlas et al. | |
| 2017/0203555 A1 | 7/2017 | Wang et al. | |
| 2018/0094438 A1 | 4/2018 | Wu et al. | |
| 2018/0094439 A1 | 4/2018 | Wang et al. | |
| 2018/0277691 A1 | 9/2018 | Karkkainen et al. | |
| 2018/0281347 A1 | 10/2018 | Gossi | |
| 2018/0351502 A1 | 12/2018 | Almy et al. | |
| 2020/0020819 A1 | 1/2020 | Farhangi | |
| 2020/0144958 A1 | 5/2020 | Rodrigues et al. | |
| 2020/0224419 A1 | 7/2020 | Boss et al. | |
| 2021/0002898 A1 | 1/2021 | Knebel et al. | |
| 2021/0044250 A1 | 2/2021 | Liu et al. | |
| 2021/0095474 A1 | 4/2021 | Yang et al. | |
| 2021/0113970 A1 | 4/2021 | Stainer et al. | |
| 2021/0171808 A1 | 6/2021 | Ackermann et al. | |
| 2021/0172174 A1 | 6/2021 | Ackermann et al. | |

FOREIGN PATENT DOCUMENTS

| | | | |
|---|---|---|---|
| EP | 1774372 B1 * | 7/2011 | ......... H01L 31/0236 |
| EP | 2784241 A1 | 10/2014 | |
| JP | 2001-098703 A | 4/2001 | |
| KR | 10-1530486 B1 | 6/2015 | |
| WO | 2011/049944 A1 | 4/2011 | |
| WO | 2015/133632 A1 | 9/2015 | |

OTHER PUBLICATIONS

RGS Energy, 3.5kW PowerHouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

* cited by examiner

PHOTOVOLTAIC MODULE WITH TEXTURED SUPERSTRATE PROVIDING SHINGLE-MIMICKING APPEARANCE

CROSS-REFERENCE TO RELATED APPLICATION

This application is a Section 111(a) application relating to and claiming the benefit of commonly-owned, U.S. Provisional Patent Application Ser. No. 62/977,863, filed Feb. 18, 2020, entitled "PHOTOVOLTAIC MODULE WITH TEXTURED SUPERSTRATE PROVIDING SHINGLE-MIMICKING APPEARANCE," the contents of which is incorporated herein by reference in its entirety.

FIELD OF THE INVENTION

The present invention relates to roof-integrated photovoltaic modules. More particularly, the present invention relates to roof-integrated photovoltaic modules with textured portions providing a non-uniform or randomized appearance, and roofing systems including such modules.

BACKGROUND

Solar modules can be placed on building roofs (e.g., residential roofs) to generate electricity. One obstacle to mass-market adoption of solar roofing is poor aesthetics. Standard rack-mounted photovoltaic ("PV") systems have a very different appearance than traditional roofing materials (e.g., asphalt shingles, wooden shingles, slate shingles, etc.), which can draw unwanted attention. Even low-profile PV systems still receive poor aesthetic feedback from consumers.

SUMMARY

In an embodiment, a system, includes at least one solar module installed on a roof deck, wherein each of the at least one solar module includes a superstrate layer having an upper surface and a lower surface opposite the upper surface, an encapsulant having an upper layer and a lower layer opposite the upper layer, wherein the upper layer is juxtaposed with the lower surface of the superstrate layer, wherein the upper layer includes a lower surface; and a photovoltaic layer intermediate the upper layer and the lower layer of the encapsulant, wherein the photovoltaic layer includes an upper surface, wherein the upper surface of the superstrate layer of a first one of the at least one solar module includes a first indentation pattern, wherein the first indentation pattern includes a mesh of indentations indented into the upper surface of the superstrate layer and a plurality of openings defined by the mesh of indentations, wherein a depth of a measured one of the indentations of the first indentation pattern is measured from (a) the upper surface of the superstrate layer to (b) a point in the measured one of the indentations of the first indentation pattern that is closest to the lower surface of the superstrate layer, and is measured in a direction perpendicular to the upper surface of the superstrate layer, wherein a majority of the indentations of the first indentation pattern have a depth of 0.25 millimeter to 0.75 millimeter, wherein a thickness of the upper layer of the encapsulant at the measured one of the indentations of the first indentation pattern is measured from (a) the upper surface of the photovoltaic layer to (b) a point in the lower surface of the upper layer of the encapsulant at the measured one of the indentations of the first indentation pattern that is closest to the upper surface of the photovoltaic layer, and is measured in a direction perpendicular to the upper surface of the photovoltaic layer, and wherein the thickness of the upper layer of the encapsulant is at least 100 microns.

In an embodiment, a majority of the plurality of openings of the first indentation pattern have a surface area of 1 square millimeter to 20 square millimeters. In an embodiment, the system further includes a substrate layer juxtaposed with the lower layer of the encapsulant. In an embodiment, the system comprises at least the first one of the at least one solar module and a second one of the at least one solar module, wherein the second one of the at least one solar module is disposed adjacent to the first one of the at least one solar module, wherein the upper surface of the superstrate layer of the second one of the at least one solar module includes a second indentation pattern, and wherein the second indentation pattern is different from the first indentation pattern.

In an embodiment, the difference between the second indentation pattern and the first indentation pattern imparts a random appearance to the system. In an embodiment, a shape of the plurality of openings includes either a square, a rectangle, a lozenge, a hexagon, a triangle, or a circle. In an embodiment, a majority of the openings of the first indentation pattern have a surface area of 7 square millimeters to 9 square millimeters. In an embodiment, a majority of the indentations of the first indentation pattern have the depth of 0.5 millimeter to 0.75 millimeter. In an embodiment, a minimum thickness of the upper encapsulant layer is from 100 microns to 450 microns.

In an embodiment, the photovoltaic layer includes a plurality of photovoltaic elements and an encapsulant region located between a first one of the plurality of photovoltaic elements and a second one of the plurality of photovoltaic elements that is adjacent to the first one of the plurality of photovoltaic elements, and wherein the encapsulant region is filled with an encapsulant material of the encapsulant. In an embodiment, a transmission loss of power of light transmitted through the superstrate layer having the first indentation pattern is less than 2 percent as a compared to light transmitted through a comparison superstrate that is identical to the superstrate layer but lacks the first indentation pattern.

In an embodiment, a photovoltaic module includes at least one solar cell; an encapsulant encapsulating the at least one solar cell; and a frontsheet juxtaposed with the encapsulant, wherein the frontsheet includes a glass layer having a first surface, and a polymer layer having a first surface and a second surface opposite the first surface of the polymer layer, wherein the second surface of the polymer layer is attached to the first surface of the glass layer, wherein the first surface of the polymer layer includes a plurality of indentations, and wherein a majority of the plurality of indentations have a depth of 0.12 mm to 1.2 mm.

In an embodiment, the majority of the plurality of indentations have a length of 0.95 mm to 1.95 mm. In an embodiment, the majority of the plurality of indentations have a width of 1 mm to 3.24 mm. In an embodiment, the polymer layer is attached to the glass layer by an adhesive layer. In an embodiment, the adhesive layer is selected from the group consisting of thermosetting polyolefin, thermosetting polyolefin encapsulant material, thermosetting ethylene-vinyl acetate (EVA), EVA encapsulants, thermoplastic olefin, thermoplastic polyolefin (TPO) and hybrids and combinations thereof. In an embodiment, the adhesive layer includes a thermosetting polyolefin encapsulant material. In an embodiment, the adhesive layer has a thickness of 1 μm to 900 μm. In an embodiment, the polymer layer includes a fluoropolymer. In an embodiment, the fluoropolymer is selected from the group consisting of ethylene tetrafluoroethylene (ETFE), polyvinylidene fluoride (PVDF), tetrafluoroethylene-hexafluoropropylene copolymers (FEP), tetrafluoroethylene-hexafluoropropylene-vinylidene fluoride copolymers (THV), polyvinyl fluoride (PVF), and blends thereof. In an embodiment, the polymer layer includes a material selected from the group consisting of acrylics, polyesters, silicones, and polycarbonates. In an embodiment, the polymer layer has a thickness of 0.025 mm to 0.1 mm.

In an embodiment, the photovoltaic module includes a backsheet juxtaposed with the encapsulant. In an embodiment, the backsheet includes thermoplastic polyolefin (TPO). In an embodiment, the photovoltaic module is configured to be installed on a roof deck.

DETAILED DESCRIPTION

Figure 1:
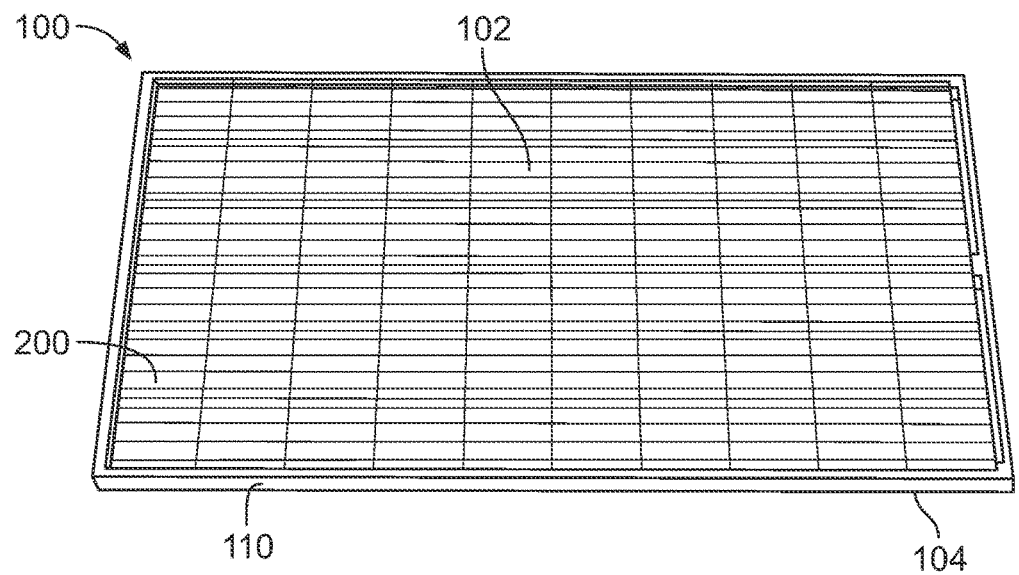
FIG. 1 shows a perspective view of an exemplary PV module.

The present invention will be further explained with reference to the attached drawings, wherein like structures are referred to by like numerals throughout the several views. The drawings shown are not necessarily to scale, with emphasis instead generally being placed upon illustrating the principles of the present invention. Further, some features may be exaggerated to show details of particular components.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

Throughout the specification and claims, the following terms take the meanings explicitly associated herein, unless the context clearly dictates otherwise. The phrases "in one embodiment" and "in some embodiments" as used herein do not necessarily refer to the same embodiment(s), though they may. Furthermore, the phrases "in another embodiment" and "in some other embodiments" as used herein do not necessarily refer to a different embodiment, although they may. Thus, as described below, various embodiments of the invention may be readily combined, without departing from the scope or spirit of the invention.

The term "based on" is not exclusive and allows for being based on additional factors not described, unless the context clearly dictates otherwise. In addition, throughout the specification, the meaning of "a," "an," and "the" include plural references. The meaning of "in" includes "in" and "on." The term "majority" as used herein is defined as more than fifty percent (50%).

The exemplary embodiments relate to layered photovoltaic ("PV") modules that include a textured superstrate (i.e., layer that faces toward the sun when the PV module is installed on a roof deck) to impart an appearance more closely resembling that of a traditional (e.g., shingled) roof. In some embodiments, an exemplary PV module having a textured superstrate is an element of a PV system including multiple PV modules, in which adjacent PV modules have textured superstrates that are patterned differently from one another, thereby imparting a random-seeming appearance to the PV system.

FIG. 1 shows an exemplary PV module 100. In some embodiments, the PV module 100 has an upper surface 102 (i.e., the surface that, when the PV module 100 is installed on a roof deck, faces away from the roof and toward the sun) and a lower surface 104 opposite the upper surface 102. In some embodiments, the PV module 100 includes a layered structure 200 having an upper surface 202 and a lower surface 204 opposite the lower surface 202. In some embodiments, the upper surface 202 of the layered structure forms the upper surface 102 of the PV module 100. In some embodiments, the lower surface 204 of the layered structure 200 forms the lower surface 104 of the PV module 100. In some embodiments, the PV module 100 includes one or more other elements (e.g., a spacer, an underlayment, etc.) underlaying the layered structure 200, and the lower surface 204 of the layered structure 200 does not form the lower surface 104 of the PV module 100. In some embodiments, the PV module 100 includes a frame 110 surrounding the layered structure 200. In some embodiments, the frame 110 includes a polymer. In some embodiments, the frame 110 includes a metal, such as aluminum or steel. In some embodiments, the PV module 100 includes one or more electrical connections (e.g., junction boxes) configured to electrically interconnect one of the PV module 100 with others of the PV module 100, with the electrical system of a structure to which the PV module is installed, etc.

Figure 2A:
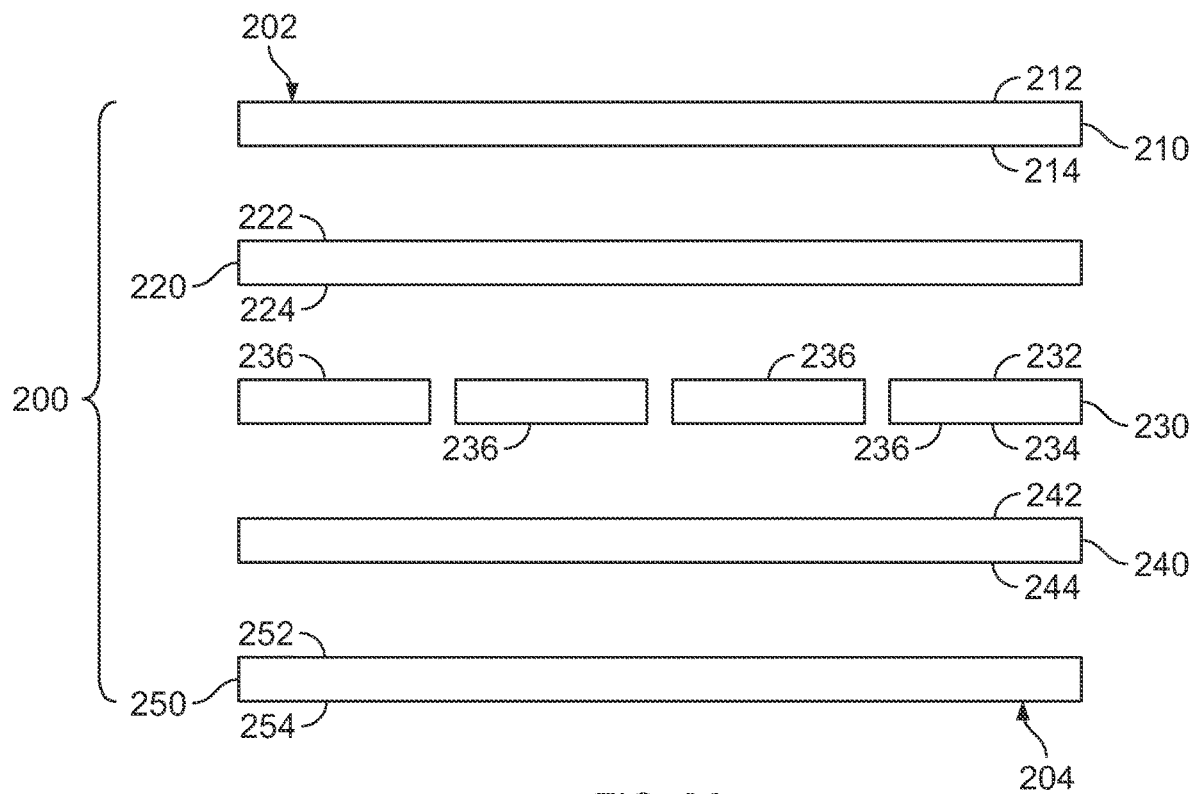
FIG. 2A shows a schematic view of elements of a layered structure of an exemplary PV module before lamination.
Figure 2B:
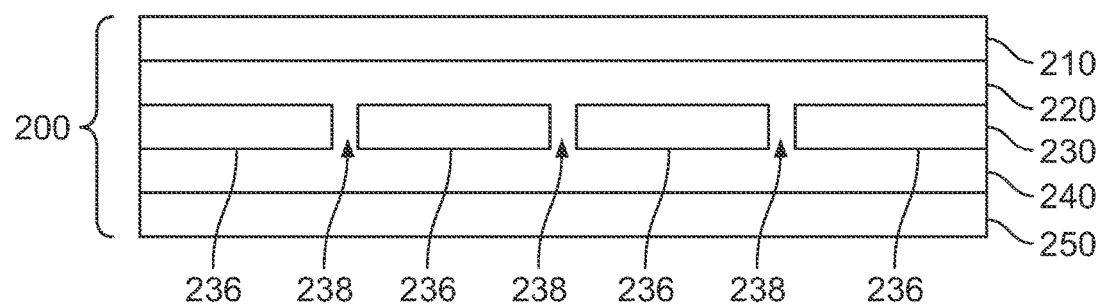
FIG. 2B shows a schematic view of a layered structure of an exemplary PV module formed by lamination of the elements shown in FIG. 2A.

FIGS. 2A and 2B show an exemplary embodiment of a layered structure 200 that, in some embodiments, forms part of the PV module 100. FIG. 2A shows an exploded view of the layers of the layered structure 200 prior to lamination to form the layered structure 200. FIG. 2B shows the layered structure following lamination. It will be apparent to those of skill in the art that FIGS. 2A and 2B present schematic views of the layered structure 200 and are not intended to provide a to-scale representation.

Referring now to FIG. 2A, in some embodiments, the layered structure 200 includes a superstrate layer 210 that forms the upper surface 202 of the layered structure 200 and the upper surface 102 of the PV module 100 (i.e., the surface that, when the PV module 100 is installed on a roof deck, faces away from the roof and toward the sun). In some embodiments, the superstrate layer 210 has an upper surface 212 (i.e., the side of the superstrate layer 210 that faces toward the sun when installed as described above) and a lower surface 214 opposite the upper surface 212. In some embodiments, the superstrate layer 210 is optically transparent (e.g., it has a solar weighted transmittance of 80% or greater). In some embodiments, the superstrate layer 210 provides electrical insulation and moisture resistance. In some embodiments, the superstrate layer 210 comprises a glass material, such as low-iron solar glass. In some embodiments, the superstrate layer 210 comprises a polymeric material such as ethylene tetrafluoroethylene ("ETFE"), polyethylene terephthalate ("PET"), or an acrylic such as polymethyl methacrylate ("PMMA"). In some embodiments, the superstrate layer 210 has a thickness of from 50 microns to 250 microns. In some embodiments, the superstrate layer 210 has a thickness of from 50 microns to 200 microns. In some embodiments, the superstrate layer 210 has a thickness of from 50 microns to 150 microns. In some embodiments, the superstrate layer 210 has a thickness of from 50 microns to 100 microns. In some embodiments, the superstrate layer 210 has a thickness of from 100 microns to 250 microns. In some embodiments, the superstrate layer 210 has a thickness of from 100 microns to 200 microns. In some embodiments, the superstrate layer 210 has a thickness of from 100 microns to 150 microns. In some embodiments, the superstrate layer 210 has a thickness of from 150 microns to 250 microns. In some embodiments, the superstrate layer 210 has a thickness of from 150 microns to 200 microns. In some embodiments, the superstrate layer 210 has a thickness of from 200 microns to 250 microns.

Continuing to refer to FIG. 2A, in some embodiments, the layered structure 200 includes an upper encapsulant layer 220. In some embodiments, the upper encapsulant layer 220 has an upper surface 222 and a lower surface 224 opposite the upper surface 222. In some embodiments, the upper surface 222 of the upper encapsulant layer 220 contacts the lower surface 214 of the superstrate layer 210. In some embodiments, the upper encapsulant layer 220 is optically transparent (e.g., it has a solar weighted transmittance of 80% or greater). In some embodiments, the upper encapsulant layer provides electrical insulation. In some embodiments, the upper encapsulant layer 220 comprises an encapsulating material such as ethylene-co-vinyl acetate ("EVA"), polydimethyl siloxane ("PDMS"), a polyolefin elastomer ("POE"), polyvinyl butyral ("PVB"), polyurethane epoxy, silicone, or an ionomer such as the series of ionomer-based encapsulants commercialized by DuPont de Nemours, Inc. under the trade name PV5400. In some embodiments, the thickness of the upper encapsulant layer 220 varies across the layered structure 200, as will be discussed in greater detail hereinafter.

Continuing to refer to FIG. 2A, in some embodiments, the layered structure 200 includes a PV layer 230 having an upper surface 232 and a lower surface 234 opposite the upper surface 232. In some embodiments, the upper surface 232 of the PV layer 230 contacts the lower surface 224 of the upper encapsulant layer 220. In some embodiments, the PV layer 230 includes at least one PV element 236. In some embodiments, the PV layer 230 includes an array of PV elements 236. In some embodiments in which the PV layer 230 includes a plurality of the PV element 236, the PV elements 236 are electrically interconnected with one another. In some embodiments, the PV layer 230 includes an array of interconnected PV elements 236. In some embodiments, gaps are formed between adjacent ones of the PV elements 236. In some embodiments, a width of the gaps are significantly smaller than a width of each of the PV elements 236. For example, in some embodiments, a width of each of the PV elements 236 is 160 millimeters and the gaps are from 2 millimeters to 5 millimeters in size. In some embodiments, the PV layer 230 also includes other active and/or passive electronic components.

Continuing to refer to FIG. 2A, in some embodiments, the layered structure 200 includes a lower encapsulant layer 240 having an upper surface 242 and a lower surface 244 opposite the upper surface 242. In some embodiments, the upper surface 242 of the lower encapsulant layer 240 contacts the lower surface 234 of the PV layer 230. In some embodiments, the lower encapsulant layer 240 provides electrical insulation. In some embodiments, the lower encapsulant layer 240 is optically transparent. In some embodiments, the lower encapsulant layer 240 is not optically transparent. In some embodiments, the thickness of the lower encapsulant layer 240 is 100 microns to 1000 microns. In some embodiments, the thickness of the lower encapsulant layer 240 is sufficiently large (e.g., greater than 100 microns) so as to prevent delamination between the PV layer 230 and a substrate 250. In some embodiments, the thickness of the lower encapsulant layer 240 is consistent across the entirety of the layered structure 200. In some embodiments, the lower encapsulant layer 240 comprises an encapsulating material such as ethylene-co-vinyl acetate ("EVA"), polydimethyl siloxane ("PDMS"), a polyolefin elastomer ("POE"), polyvinyl butyral ("PVB"), polyurethane epoxy, silicone, or an ionomer such as the series of ionomer-based encapsulants commercialized by DuPont de Nemours, Inc. under the trade name PV5400. In some embodiments, the lower encapsulant layer 240 comprises the same encapsulating material as the upper encapsulant layer 220.

Continuing to refer to FIG. 2A, in some embodiments, the layered structure 200 includes a substrate 250 having an upper surface 252 and a lower surface 254 opposite the lower surface 252. In some embodiments, the upper surface 252 of the substrate 250 contacts the lower surface 244 of the lower encapsulant layer 240. In some embodiments, the lower surface 254 of the substrate 250 forms the lower surface 204 of the layered structure 200. In some embodiments, the substrate 250 provides electrical insulation and moisture resistance. In some embodiments, the substrate 250 is optically transparent. In some embodiments, the substrate 250 is not optically transparent. In some embodiments, the substrate 250 comprises a glass material. In some embodiments, the substrate 250 comprises a polymeric material such as ETFE, PET, an acrylic such as PMMA, polypropylene, polyvinyl chloride ("PVC"), or a glass-reinforced or fiber-reinforced composite such as a material meeting the National Electrical Manufacturers Association ("NEMA") grades FR-4 or G-10. In some embodiments, the substrate 250 has a thickness of 200 microns to ¼ inch. In some embodiments, the substrate 250 is sufficiently rigid to provide mechanical stiffening to the PV module 100. In an embodiment, the substrate 250 is unpainted.

Referring now to FIG. 2B, the layered structure 200 is shown following lamination. In some embodiments, during the lamination process, the encapsulating material of the upper encapsulant layer 220 and the encapsulating material of the lower encapsulant layer 240 are melted and flow within the gaps between adjacent ones of the PV elements 236 shown in FIG. 2A, thereby encapsulating (e.g., surrounding on all sides) each of the PV elements 236 with encapsulating material. In some embodiments, as a result of this process, the PV layer 230 includes encapsulant portions 238 located between adjacent ones of the PV elements 236, and providing continuity between the encapsulating material of the upper encapsulant layer 220 and the encapsulating material of the lower encapsulant layer 240. In some embodiments, the resulting region of the layered structure 200 (e.g., the upper encapsulant layer 220, the PV layer 230, and the lower encapsulant layer 240) resembles a single block of encapsulant material with the PV elements positioned therein. In some embodiments, none of the layers of the layered structure 200 is painted. In some embodiments, the superstrate layer 210 and the substrate 250 are unpainted.

Figure 3:
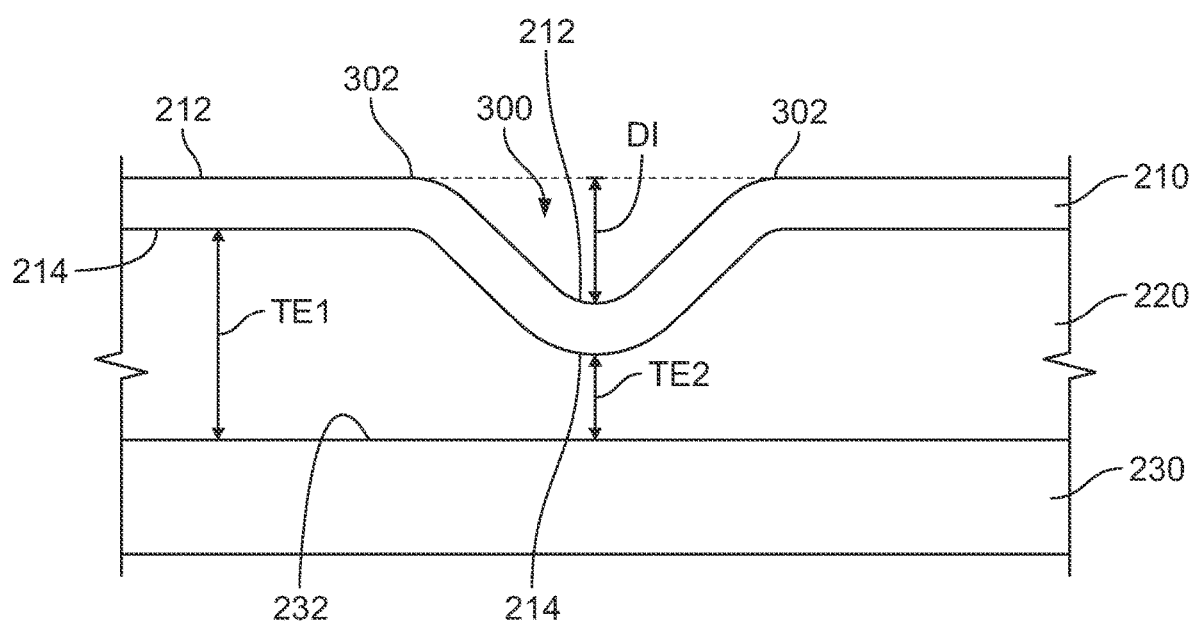
FIG. 3 shows a detailed view of an indentation in a superstrate layer of an exemplary PV module.

Referring now to FIGS. 3 and 4, in some embodiments, the superstrate layer 210 includes a plurality of indentations that are formed in the upper surface 212 thereof, and that form a pattern. FIG. 3 shows a schematic cross-sectional view of a portion of an embodiment of the superstrate layer 210, the upper encapsulant layer 220, and the PV layer 230. In some embodiments, the superstrate layer 210 has an indentation 300 formed therein. For clarity, FIG. 3 shows a single one of the indentations 300, but it will be apparent to those of skill in the art that the superstrate layer 210 includes a plurality of the indentations 300 forming a pattern, as will be discussed in further detail hereinafter.

In some embodiments, the indentation 300 is formed by impressing a pattern of the indentation 300 into the superstrate layer 210. In some embodiments in which the superstrate layer 210 includes a glass material, the indentation 300 is formed in the superstrate layer 210 during fabrication of the superstrate layer 210. In some embodiments in which the superstrate layer 210 includes a polymeric material, the indentation 300 is formed in the superstrate layer 210 during a lamination process by which the layered structure 200 is assembled. As shown in FIG. 3, each of the indentations 300 is considered to be bounded at edges 302, which are the points where the upper surface 212 of the superstrate layer 210 returns to its nominal, undepressed position.

In some embodiments, the superstrate layer 210 retains substantially the same thickness at the indentation 300 as surrounding the indentation 300. In some embodiments, the indentation 300 has a depth DI as measured between (a) the upper surface 212 of the superstrate layer 210 at the indentation 300 and (b) the upper surface 212 of the superstrate layer 210 at a location that lacks the indentation 300, in a direction that is perpendicular to the layering direction of the layered structure 200. In some embodiments, the depth DI is from 0.25 millimeters to 0.75 millimeters. In some embodiments, the depth DI is from 0.25 millimeters to 0.625 millimeters. In some embodiments, the depth DI is from 0.25 millimeters to 0.5 millimeters. In some embodiments, the depth DI is from 0.25 millimeters to 0.375 millimeters. In some embodiments, the depth DI is from 0.375 millimeters to 0.75 millimeters. In some embodiments, the depth DI is from 0.375 millimeters to 0.625 millimeters. In some embodiments, the depth DI is from 0.375 millimeters to 0.5 millimeters. In some embodiments, the depth DI is from 0.5 millimeters to 0.75 millimeters. In some embodiments, the depth DI is from 0.5 millimeters to 0.625 millimeters. In some embodiments, the depth DI is from 0.625 millimeters to 0.75 millimeters.

In some embodiments, the upper encapsulant layer 220 is thinner at the indentation 300 than in areas surrounding the indentation 300. In some embodiments, the upper encapsulant layer 220 has a first thickness TE1 at areas surrounding the indentation 300 and a second thickness TE2 at the indentation 300, both thicknesses TE1, TE2 being measured from the lower surface 214 of the superstrate layer 210 to the upper surface 232 of the PV layer 230 in a direction that is perpendicular to the layering direction of the layered structure 200. In some embodiments, the second thickness TE2 is from 100 to 450 microns. In some embodiments, the second thickness TE2 is from 100 to 275 microns. In some embodiments, the second thickness TE2 is from 275 to 450 microns. In some embodiments, the second thickness TE2 is at least sufficiently large (e.g., greater than 100 microns) in order prevent delamination between the superstrate layer 210 and the PV layer 230.

Referring now to FIGS. 4A-4E, top views of exemplary patterns 400, 420, 440, 460, 480 of the indentations 300 is shown. The pattern 400 shown in FIG. 4A includes a pattern of squares. The pattern 420 shown in FIG. 4B includes a pattern of non-rectangular quadrilaterals (e.g., lozenges). The pattern 440 shown in FIG. 4C includes a pattern of circles. The pattern 460 shown in FIG. 4D includes a pattern of hexagons. In some embodiments, the superstrate layer 210 includes a pattern including one or more types of polygons, such as triangles, quadrilaterals, pentagons, rectangles, hexagons, etc. The pattern 480 shown in FIG. 4E includes a pattern of triangles and a pattern of circles. It will be apparent to those of skill in the art that the specific patterns 400, 420, 440, 460, 480 shown in FIGS. 4A-4E are only exemplary and that any number of other geometric or non-geometric patterns are possible. In some embodiments, the superstrate layer 210 includes a uniform pattern. In some embodiments, the superstrate layer 210 includes a non-uniform pattern. In some embodiments, the superstrate layer 210 includes a combination of patterns in connection with one another. In some embodiments, the superstrate layer 210 includes a pattern having a size gradient (e.g., including similarly shaped elements of different sizes, such as differently sized triangles, adjacent to one another).

Figure 4A:
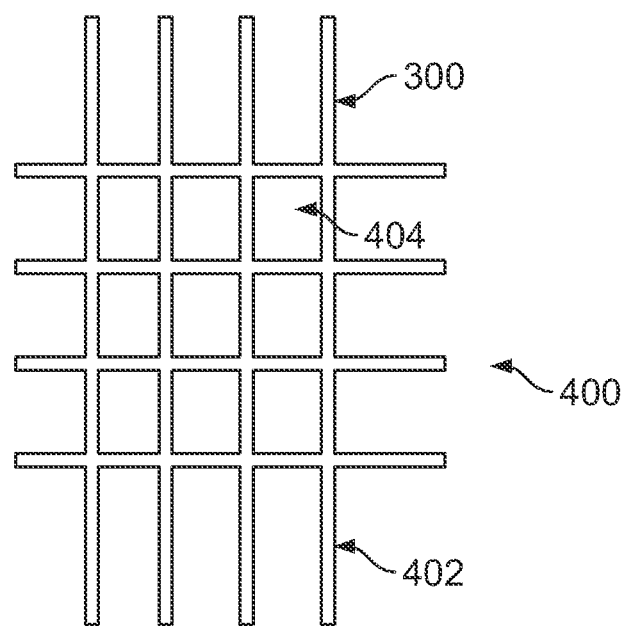
FIG. 4A shows a first exemplary pattern of indentations in a superstrate layer of an exemplary PV module.

In some embodiments, the patterns 400, 420, 440, 460, or 480 includes a mesh 402, 422, 442, 462, 482 of the indentations 300, respectively, and a plurality of openings 404, 424, 444, 464, 484, respectively, defined by the respective mesh 402, 422, 442, 462, 482 (for clarity, only one of the openings 404, 424, 444, 464, 484 is specifically identified in the respective one of FIGS. 4A-4E). In some embodiments, the indentations 300 forming the mesh 402, 422, 442, 462, 482 are equally spaced across the entire mesh 402, 422, 442, 462, 482. For example, FIG. 4A shows a mesh 402 of squares formed by depressions that are evenly spaced at 3-millimeter intervals. In some embodiments, the indentations 300 are irregularly spaced. In some embodiments, each of the openings 404, 424, 444, 464, 484 has a surface area of from 1 square millimeter to 20 square millimeters, with the surface area being measured between the edges 302 of each of the indentations 300 surrounding a given opening. For example, referring to FIG. 4A, each of the indentations 300 forming the mesh 402 is represented by a line, with the thickness of each line representing the width of each of the indentations 300 from one edge 302 to the opposing edge 302. As shown in FIG. 4A, each of the openings 404 is represented by the white space between the lines representing the indentations 300. The area of each of the white space regions corresponds to the surface area of the corresponding one of the openings 404.

In some embodiments, each of the openings 404, 424, 444, 464, 484 has a surface area of from 1 square millimeter to 15 square millimeters. In some embodiments, each of the openings 404, 424, 444, 464, 484 has a surface area of from 1 square millimeter to 10 square millimeters. In some embodiments, each of the openings 404, 424, 444, 464, 484 has a surface area of from 5 square millimeters to 20 square millimeters. In some embodiments, each of the openings 404, 424, 444, 464, 484 has a surface area of from 5 square millimeters to 15 square millimeters. In some embodiments, each of the openings 404, 424, 444, 464, 484 has a surface area of from 5 square millimeters to 10 square millimeters. In some embodiments, each of the openings 404, 424, 444, 464, 484 has a surface area of from 10 square millimeters to 20 square millimeters. In some embodiments, each of the openings 404, 424, 444, 464, 484 has a surface area of from 10 square millimeters to 15 square millimeters. In some embodiments, each of the openings 404, 424, 444, 464, 484 has a surface area of from 15 square millimeters to 20 square millimeters. In some embodiments, each of the openings 404, 424, 444, 464, 484 has a surface area of from 1 square millimeter to 9 square millimeters. In some embodiments, each of the openings 404, 424, 444, 464, 484 has a surface area of from 1 square millimeter to 5 square millimeters. In some embodiments, each of the openings 404, 424, 444, 464, 484 has a surface area of from 5 square millimeters to 9 square millimeters.

In some embodiments, the PV module 100 having the layered structure 200 including the superstrate layer 210 with the indentations 300 having a pattern as described above (e.g., wherein each of the indentations 300 has a depth of from 0.25 to 0.75 millimeters and the minimum thickness of the upper encapsulant layer 220 below each of the indentations 300 is from 100 to 450 microns) provides little to no loss of transmission power (i.e., power of transmitted light) as compared to a comparison PV module that is identical to the PV module 100 but lacks the indentations 300. In some embodiments, the transmission power loss is less than 2%.

Figure 5:
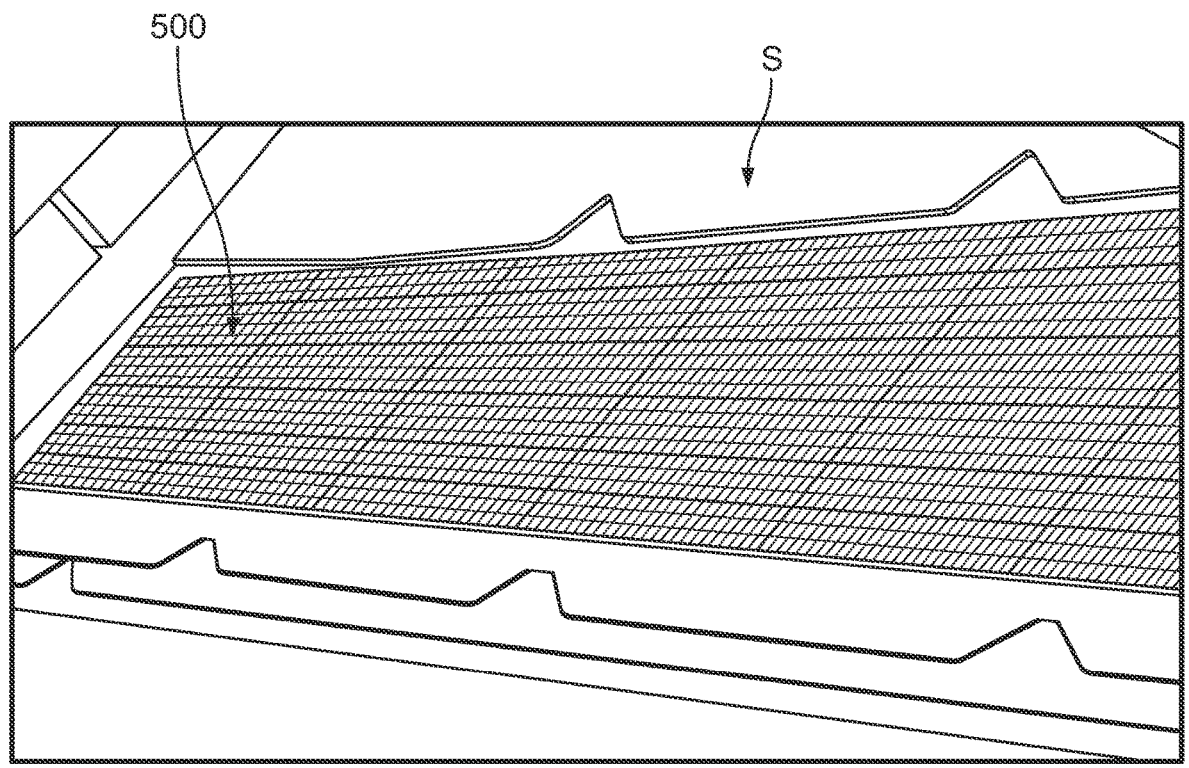
FIG. 5 shows exemplary PV modules as installed on a representative roof deck.

In some embodiments, the PV module 100 having the layered structure 200 including a superstrate with the indentations 300 having a pattern as described above mimics the appearance of asphalt shingles that may form at least a portion of a roof on which the PV module 100 is to be installed. FIG. 5 shows an embodiment of a PV module 500 adjacent to representative asphalt shingles S. It may be seen that the PV module 500 mimics the appearance of the asphalt shingles S.

Figure 6:
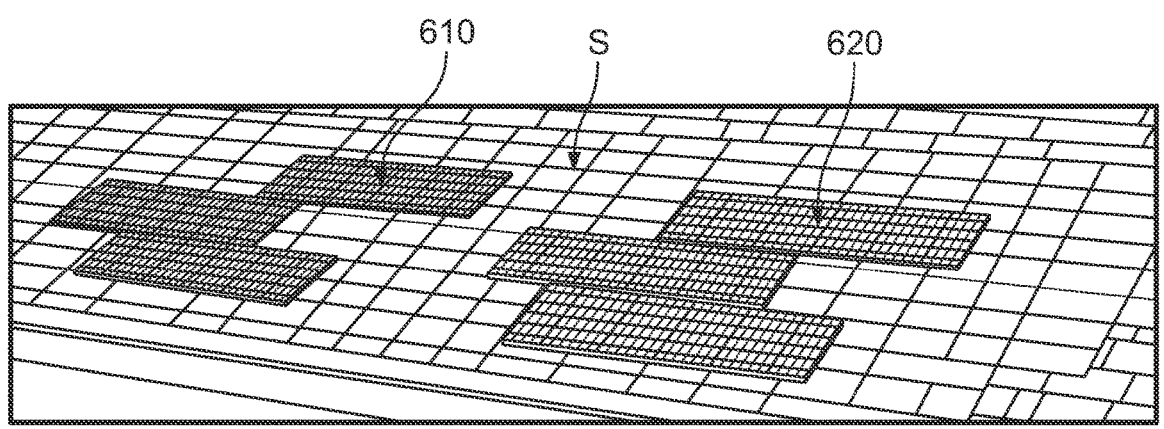
FIG. 6 shows exemplary PV modules as installed on a representative roof deck.

In some embodiments, the appearance of the PV module 100 depends on the material (e.g., a glass material, a polymeric material, etc.) used to form the superstrate layer 210 FIG. 6 shows two embodiments of the PV module 100 adjacent to representative asphalt shingles 5, including a first PV module 610 having the superstrate layer 210 comprising a glass material and a second PV module 620 having the superstrate layer 210 comprising a polymeric material.

Figure 7:
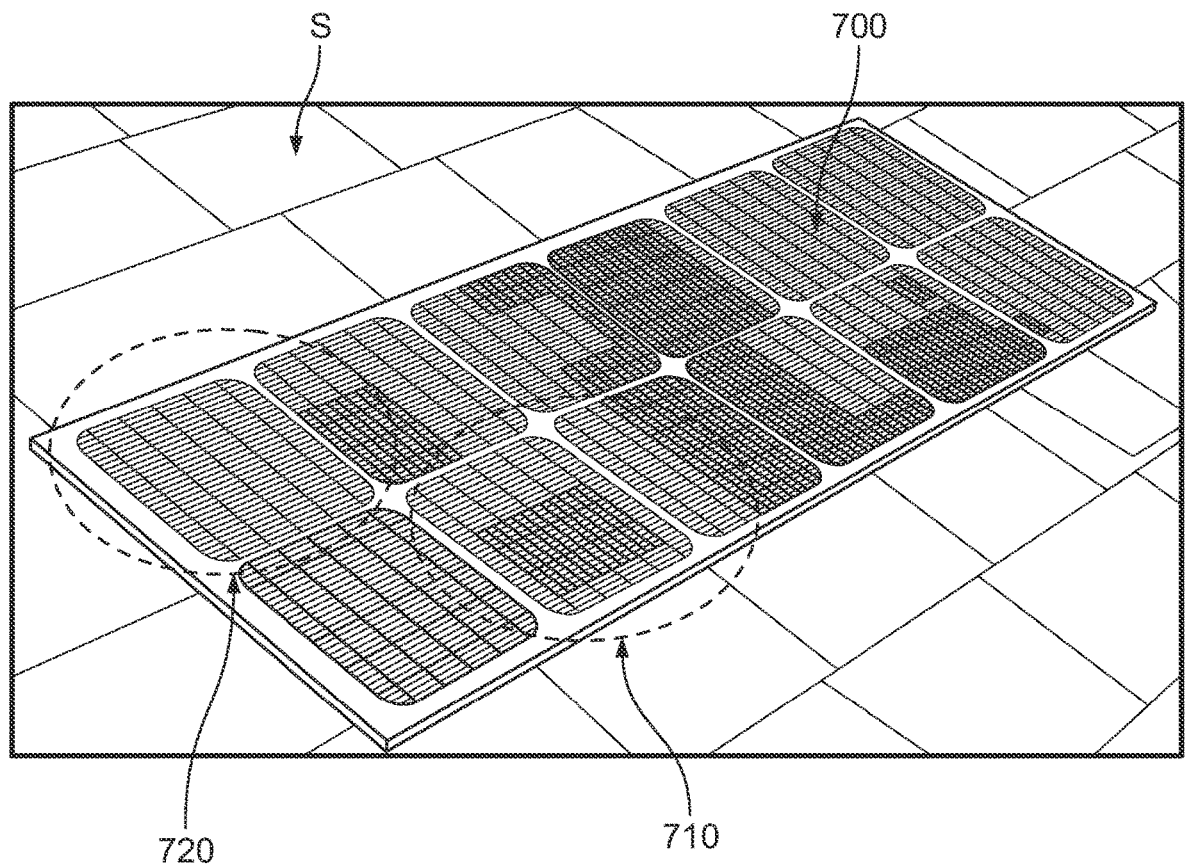
FIG. 7 shows an exemplary PV module as installed on a representative roof.

In some embodiments, a single one of the PV module 100 includes the indentations 300 forming differing patterns at differing portions of the superstrate layer 210. FIG. 7 shows a PV module 700 having the indentations 300 in different patterns at different regions of the superstrate layer 210, adjacent to representative asphalt shingles S. The PV module 700 includes a first region 710 having a first pattern and a second region 720 having a second pattern. It will be apparent to those of skill in the art that the PV module 700 also includes other regions, but, for clarity, only the first and second regions 710 and 720 are specifically identified in FIG. 7. In some embodiments, by including different texture patterns and randomizing the arrangement of the patterns, the PV module 700 can have variation in its apparent color and mimic the appearance of adjacent asphalt shingles S.

Figure 8:
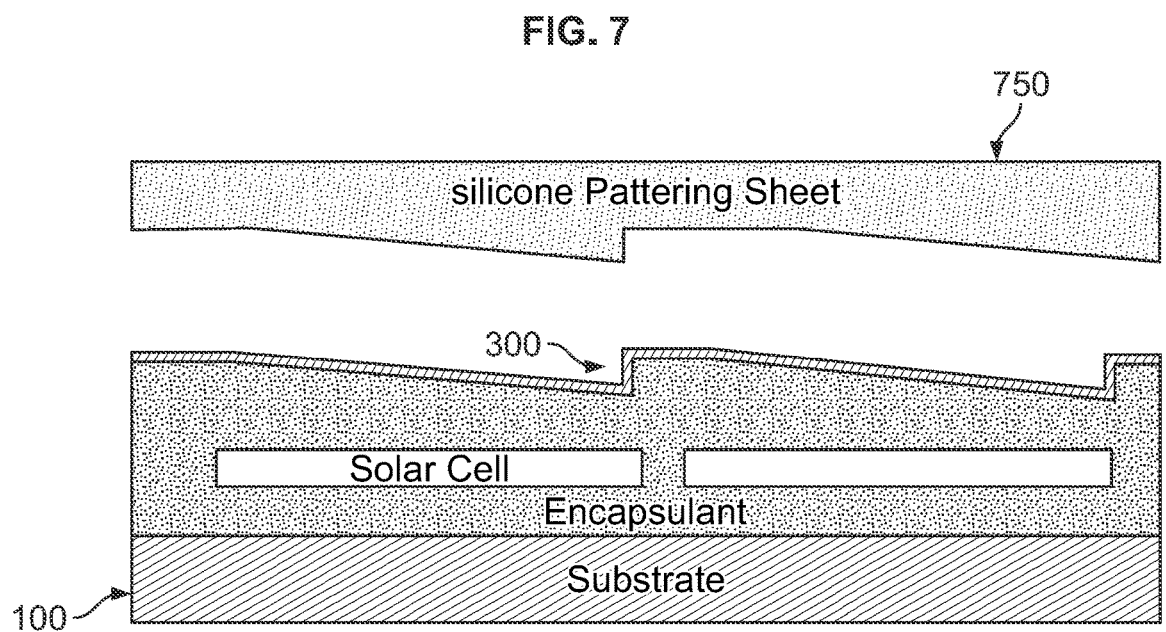
FIG. 8 shows a schematic view of an exemplary mold used to impart a texture to an exemplary PV module.

In some embodiments, in which the superstrate layer 210 of the PV module 100 includes a polymeric material, a pattern of the indentations 300 is created using a mold made from silicon or another suitable material that will hold its shape and shape the superstrate layer 210 appropriately. FIG. 8 shows an embodiment of the PV module 100 along with an embodiment of a mold 750. In another embodiment, the indentations 300 are created by embossing a portion of the superstrate layer 210. In another embodiment, the indentations 300 are created by embossing a polymer layer of the superstrate layer 210.

Figure 4B:
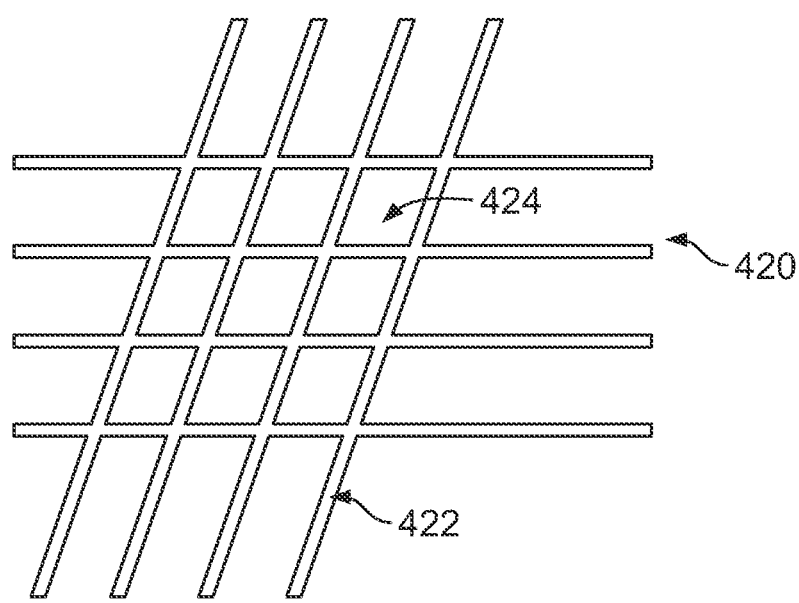
FIG. 4B shows a second exemplary pattern of indentations in a superstrate layer of an exemplary PV module.
Figure 4C:
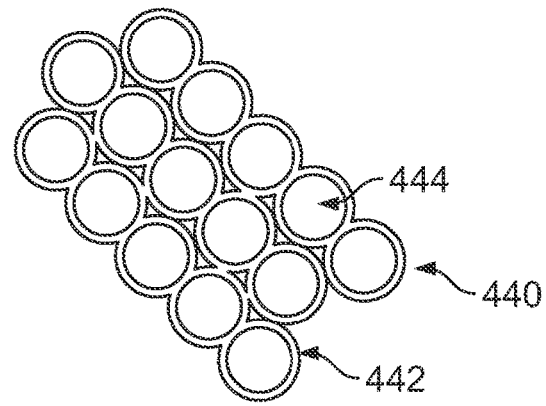
FIG. 4C shows a third exemplary pattern of indentations in a superstrate layer of an exemplary PV module.
Figure 4D:
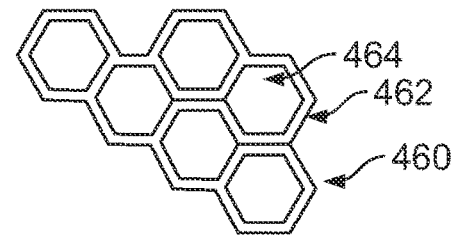
FIG. 4D shows a fourth exemplary pattern of indentations in a superstrate layer of an exemplary PV module.
Figure 4E:
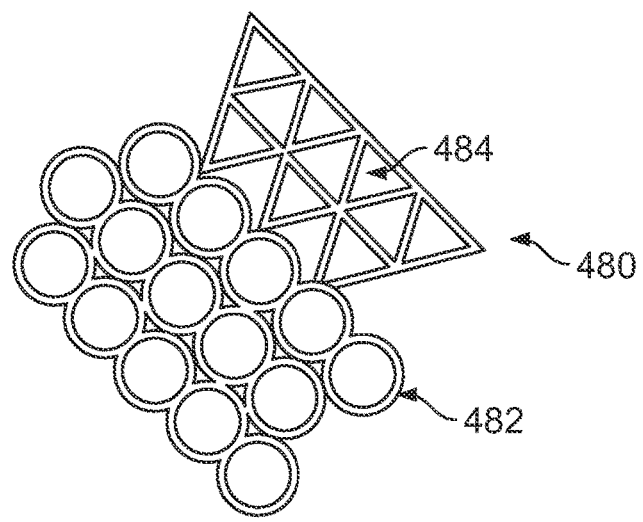
FIG. 4E shows a fifth exemplary pattern of indentations in a superstrate layer of an exemplary PV module.

In some embodiments, a PV system including a plurality of the PV module 100 will include some of the PV modules 100 having different patterns than others (e.g., one of the PV module will include the pattern 400 shown in FIG. 4A, another of the PV module 100 will include the pattern 420 shown in FIG. 4B, etc.). In some embodiments, to provide a random appearance to the PV system mimicking the random appearance of a roof including asphalt shingles, the PV modules 100 are not allowed to repeat patterns within a certain number of the PV modules 100 either vertically or horizontally. For example, in some embodiments, the PV modules 100 are not allowed to repeat patterns within one of the PV modules 100 or horizontally, or within two of the PV modules 100 or horizontally, or within three of the PV modules 100 or horizontally, or within four of the PV modules 100 or horizontally, etc.

Figure 9:
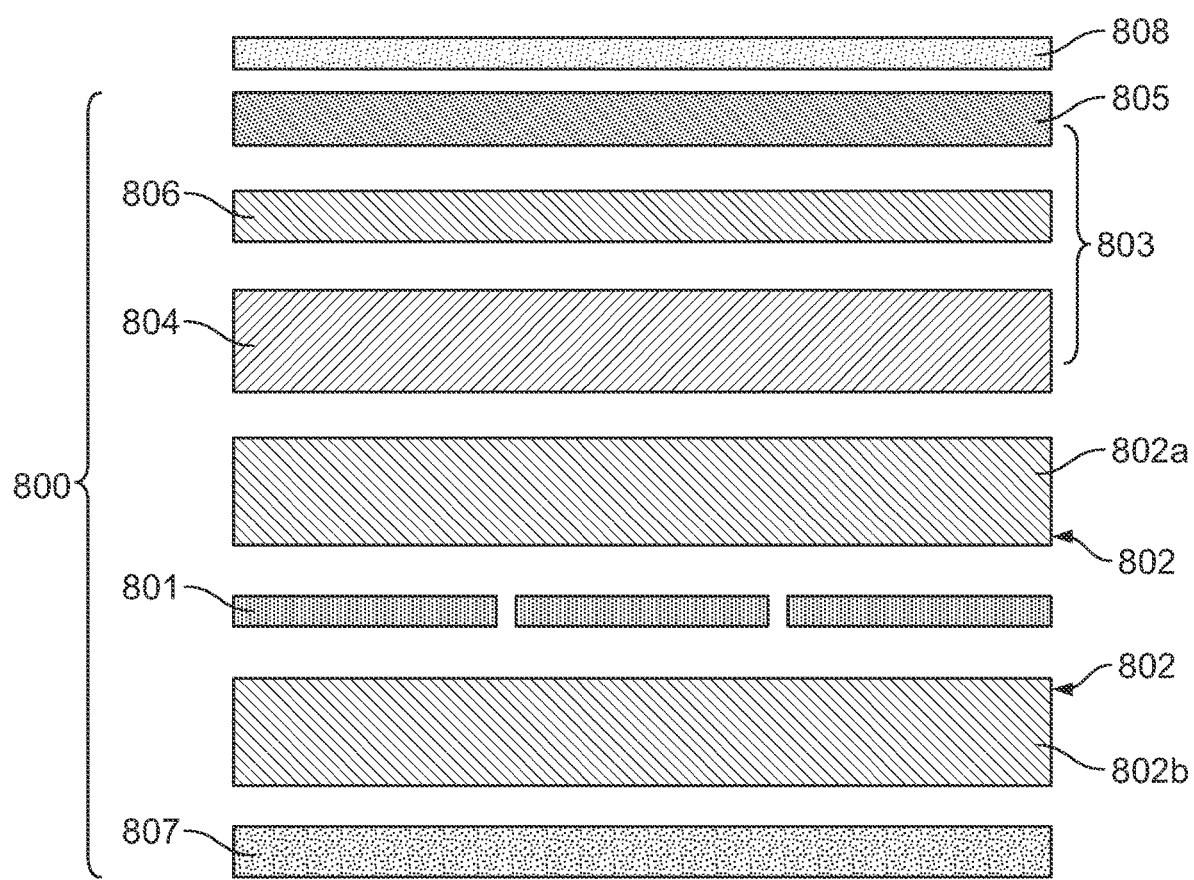
FIG. 9 shows a schematic view of an embodiment of a photovoltaic module.

Referring to FIG. 9, in an embodiment, a photovoltaic module 800 includes at least one solar cell 801, an encapsulant 802 encapsulating the at least one solar cell 801, and a frontsheet 803 juxtaposed with the encapsulant 802. As used herein, the terms "encapsulating" and "encapsulates" mean to partially or fully envelope or enclose, and with respect to certain embodiments of the photovoltaic module 800, the at least one solar cell 801 is fully enveloped by or enclosed within the encapsulant 802, or partially enveloped by or enclosed within the encapsulant 802. In an embodiment, the encapsulant 802 includes a first layer 802a and a second layer 802b.

In an embodiment, the encapsulant 802 may be made from polyolefins, ethyl vinyl acetates, ionomers, silicones, poly vinyl butyral, epoxies, polyurethanes, or combinations/hybrids thereof. In an embodiment, the encapsulant 802 is made from thermosetting polyolefin.

In an embodiment, the encapsulant 802 includes a thickness of 0.4 mm to 1.8 mm. In another embodiment, the encapsulant 802 includes a thickness of 0.4 mm to 1.7 mm. In another embodiment, the encapsulant 802 includes a thickness of 0.4 mm to 1.6 mm. In another embodiment, the encapsulant 802 includes a thickness of 0.4 mm to 1.5 mm. In another embodiment, the encapsulant 802 includes a thickness of 0.4 mm to 1.4 mm. In another embodiment, the encapsulant 802 includes a thickness of 0.4 mm to 1.3 mm. In another embodiment, the encapsulant 802 includes a thickness of 0.4 mm to 1.2 mm. In another embodiment, the encapsulant 802 includes a thickness of 0.4 mm to 1.1 mm. In another embodiment, the encapsulant 802 includes a thickness of 0.4 mm to 1.0 mm. In another embodiment, the encapsulant 802 includes a thickness of 0.4 mm to 0.9 mm. In another embodiment, the encapsulant 802 includes a thickness of 0.4 mm to 0.8 mm. In another embodiment, the encapsulant 802 includes a thickness of 0.4 mm to 0.7 mm. In another embodiment, the encapsulant 802 includes a thickness of 0.4 mm to 0.6 mm. In another embodiment, the encapsulant 802 includes a thickness of 0.4 mm to 0.5 mm.

In an embodiment, the encapsulant 802 includes a thickness of 0.5 mm to 1.8 mm. In another embodiment, the encapsulant 802 includes a thickness of 0.5 mm to 1.7 mm. In another embodiment, the encapsulant 802 includes a thickness of 0.5 mm to 1.6 mm. In another embodiment, the encapsulant 802 includes a thickness of 0.5 mm to 1.5 mm. In another embodiment, the encapsulant 802 includes a thickness of 0.5 mm to 1.4 mm. In another embodiment, the encapsulant 802 includes a thickness of 0.5 mm to 1.3 mm. In another embodiment, the encapsulant 802 includes a thickness of 0.5 mm to 1.2 mm. In another embodiment, the encapsulant 802 includes a thickness of 0.5 mm to 1.1 mm. In another embodiment, the encapsulant 802 includes a thickness of 0.5 mm to 1.0 mm. In another embodiment, the encapsulant 802 includes a thickness of 0.5 mm to 0.9 mm. In another embodiment, the encapsulant 802 includes a thickness of 0.5 mm to 0.8 mm. In another embodiment, the encapsulant 802 includes a thickness of 0.5 mm to 0.7 mm. In another embodiment, the encapsulant 802 includes a thickness of 0.5 mm to 0.6 mm.

In an embodiment, the encapsulant 802 includes a thickness of 0.6 mm to 1.8 mm. In another embodiment, the encapsulant 802 includes a thickness of 0.6 mm to 1.7 mm. In another embodiment, the encapsulant 802 includes a thickness of 0.6 mm to 1.6 mm. In another embodiment, the encapsulant 802 includes a thickness of 0.6 mm to 1.5 mm. In another embodiment, the encapsulant 802 includes a thickness of 0.6 mm to 1.4 mm. In another embodiment, the encapsulant 802 includes a thickness of 0.6 mm to 1.3 mm. In another embodiment, the encapsulant 802 includes a thickness of 0.6 mm to 1.2 mm. In another embodiment, the encapsulant 802 includes a thickness of 0.6 mm to 1.1 mm. In another embodiment, the encapsulant 802 includes a thickness of 0.6 mm to 1.0 mm. In another embodiment, the encapsulant 802 includes a thickness of 0.6 mm to 0.9 mm. In another embodiment, the encapsulant 802 includes a thickness of 0.6 mm to 0.8 mm. In another embodiment, the encapsulant 802 includes a thickness of 0.6 mm to 0.7 mm.

In an embodiment, the encapsulant 802 includes a thickness of 0.7 mm to 1.8 mm. In another embodiment, the encapsulant 802 includes a thickness of 0.7 mm to 1.7 mm. In another embodiment, the encapsulant 802 includes a thickness of 0.7 mm to 1.6 mm. In another embodiment, the encapsulant 802 includes a thickness of 0.7 mm to 1.5 mm. In another embodiment, the encapsulant 802 includes a thickness of 0.7 mm to 1.4 mm. In another embodiment, the encapsulant 802 includes a thickness of 0.7 mm to 1.3 mm. In another embodiment, the encapsulant 802 includes a thickness of 0.7 mm to 1.2 mm. In another embodiment, the encapsulant 802 includes a thickness of 0.7 mm to 1.1 mm. In another embodiment, the encapsulant 802 includes a thickness of 0.7 mm to 1.0 mm. In another embodiment, the encapsulant 802 includes a thickness of 0.7 mm to 0.9 mm. In another embodiment, the encapsulant 802 includes a thickness of 0.7 mm to 0.8 mm.

In an embodiment, the encapsulant 802 includes a thickness of 0.8 mm to 1.8 mm. In another embodiment, the encapsulant 802 includes a thickness of 0.8 mm to 1.7 mm. In another embodiment, the encapsulant 802 includes a thickness of 0.8 mm to 1.6 mm. In another embodiment, the encapsulant 802 includes a thickness of 0.8 mm to 1.5 mm. In another embodiment, the encapsulant 802 includes a thickness of 0.8 mm to 1.4 mm. In another embodiment, the encapsulant 802 includes a thickness of 0.8 mm to 1.3 mm. In another embodiment, the encapsulant 802 includes a thickness of 0.8 mm to 1.2 mm. In another embodiment, the encapsulant 802 includes a thickness of 0.8 mm to 1.1 mm. In another embodiment, the encapsulant 802 includes a thickness of 0.8 mm to 1.0 mm. In another embodiment, the encapsulant 802 includes a thickness of 0.8 mm to 0.9 mm.

In an embodiment, the encapsulant 802 includes a thickness of 0.9 mm to 1.8 mm. In another embodiment, the encapsulant 802 includes a thickness of 0.9 mm to 1.7 mm. In another embodiment, the encapsulant 802 includes a thickness of 0.9 mm to 1.6 mm. In another embodiment, the encapsulant 802 includes a thickness of 0.9 mm to 1.5 mm. In another embodiment, the encapsulant 802 includes a thickness of 0.9 mm to 1.4 mm. In another embodiment, the encapsulant 802 includes a thickness of 0.9 mm to 1.3 mm. In another embodiment, the encapsulant 802 includes a thickness of 0.9 mm to 1.2 mm. In another embodiment, the encapsulant 802 includes a thickness of 0.9 mm to 1.1 mm. In another embodiment, the encapsulant 802 includes a thickness of 0.9 mm to 1.0 mm.

In an embodiment, the encapsulant 802 includes a thickness of 1.0 mm to 1.8 mm. In another embodiment, the encapsulant 802 includes a thickness of 1.0 mm to 1.7 mm. In another embodiment, the encapsulant 802 includes a thickness of 1.0 mm to 1.6 mm. In another embodiment, the encapsulant 802 includes a thickness of 1.0 mm to 1.5 mm. In another embodiment, the encapsulant 802 includes a thickness of 1.0 mm to 1.4 mm. In another embodiment, the encapsulant 802 includes a thickness of 1.0 mm to 1.3 mm. In another embodiment, the encapsulant 802 includes a thickness of 1.0 mm to 1.2 mm. In another embodiment, the encapsulant 802 includes a thickness of 1.0 mm to 1.1 mm.

In an embodiment, the encapsulant 802 includes a thickness of 1.1 mm to 1.8 mm. In another embodiment, the encapsulant 802 includes a thickness of 1.1 mm to 1.7 mm. In another embodiment, the encapsulant 802 includes a thickness of 1.1 mm to 1.6 mm. In another embodiment, the encapsulant 802 includes a thickness of 1.1 mm to 1.5 mm. In another embodiment, the encapsulant 802 includes a thickness of 1.1 mm to 1.4 mm. In another embodiment, the encapsulant 802 includes a thickness of 1.1 mm to 1.3 mm. In another embodiment, the encapsulant 802 includes a thickness of 1.1 mm to 1.2 mm.

In an embodiment, the encapsulant 802 includes a thickness of 1.2 mm to 1.8 mm. In another embodiment, the encapsulant 802 includes a thickness of 1.2 mm to 1.7 mm. In another embodiment, the encapsulant 802 includes a thickness of 1.2 mm to 1.6 mm. In another embodiment, the encapsulant 802 includes a thickness of 1.2 mm to 1.5 mm. In another embodiment, the encapsulant 802 includes a thickness of 1.2 mm to 1.4 mm. In another embodiment, the encapsulant 802 includes a thickness of 1.2 mm to 1.3 mm.

In an embodiment, the encapsulant 802 includes a thickness of 1.3 mm to 1.8 mm. In another embodiment, the encapsulant 802 includes a thickness of 1.3 mm to 1.7 mm. In another embodiment, the encapsulant 802 includes a thickness of 1.3 mm to 1.6 mm. In another embodiment, the encapsulant 802 includes a thickness of 1.3 mm to 1.5 mm. In another embodiment, the encapsulant 802 includes a thickness of 1.3 mm to 1.4 mm.

In an embodiment, the encapsulant 802 includes a thickness of 1.4 mm to 1.8 mm. In another embodiment, the encapsulant 802 includes a thickness of 1.4 mm to 1.7 mm. In another embodiment, the encapsulant 802 includes a thickness of 1.4 mm to 1.6 mm. In another embodiment, the encapsulant 802 includes a thickness of 1.4 mm to 1.5 mm.

In an embodiment, the encapsulant 802 includes a thickness of 1.5 mm to 1.8 mm. In another embodiment, the encapsulant 802 includes a thickness of 1.5 mm to 1.7 mm. In another embodiment, the encapsulant 802 includes a thickness of 1.5 mm to 1.6 mm. In an embodiment, the encapsulant 802 includes a thickness of 1.6 mm to 1.8 mm. In another embodiment, the encapsulant 802 includes a thickness of 1.6 mm to 1.7 mm. In an embodiment, the encapsulant 802 includes a thickness of 1.7 mm to 1.8 mm. In an embodiment, the encapsulant 802 includes a thickness of 0.4 mm. In an embodiment, the encapsulant 802 includes a thickness of 0.5 mm. In an embodiment, the encapsulant 802 includes a thickness of 0.6 mm. In an embodiment, the encapsulant 802 includes a thickness of 0.7 mm. In an embodiment, the encapsulant 802 includes a thickness of 0.8 mm. In an embodiment, the encapsulant 802 includes a thickness of 0.9 mm. In an embodiment, the encapsulant 802 includes a thickness of 1.0 mm. In an embodiment, the encapsulant 802 includes a thickness of 1.1 mm. In an embodiment, the encapsulant 802 includes a thickness of 1.2 mm. In an embodiment, the encapsulant 802 includes a thickness of 1.3 mm. In an embodiment, the encapsulant 802 includes a thickness of 1.4 mm. In an embodiment, the encapsulant 802 includes a thickness of 1.5 mm. In an embodiment, the encapsulant 802 includes a thickness of 1.6 mm. In an embodiment, the encapsulant 802 includes a thickness of 1.7 mm. In an embodiment, the encapsulant 802 includes a thickness of 1.8 mm.

In an embodiment, the first layer 802a of the encapsulant 802 includes a thickness of 0.2 mm to 0.9 mm. In another embodiment, the first layer 802a of the encapsulant 802 includes a thickness of 0.2 mm to 0.8 mm. In another embodiment, the first layer 802a of the encapsulant 802 includes a thickness of 0.2 mm to 0.7 mm. In another embodiment, the first layer 802a of the encapsulant 802 includes a thickness of 0.2 mm to 0.6 mm. In another embodiment, the first layer 802a of the encapsulant 802 includes a thickness of 0.2 mm to 0.5 mm. In another embodiment, the first layer 802a of the encapsulant 802 includes a thickness of 0.2 mm to 0.4 mm. In another embodiment, the first layer 802a of the encapsulant 802 includes a thickness of 0.2 mm to 0.3 mm.

In an embodiment, the first layer 802a of the encapsulant 802 includes a thickness of 0.3 mm to 0.9 mm. In another embodiment, the first layer 802a of the encapsulant 802 includes a thickness of 0.3 mm to 0.8 mm. In another embodiment, the first layer 802a of the encapsulant 802 includes a thickness of 0.3 mm to 0.7 mm. In another embodiment, the first layer 802a of the encapsulant 802 includes a thickness of 0.3 mm to 0.6 mm. In another embodiment, the first layer 802a of the encapsulant 802 includes a thickness of 0.3 mm to 0.5 mm. In another embodiment, the first layer 802a of the encapsulant 802 includes a thickness of 0.3 mm to 0.4 mm.

In an embodiment, the first layer 802a of the encapsulant 802 includes a thickness of 0.4 mm to 0.9 mm. In another embodiment, the first layer 802a of the encapsulant 802 includes a thickness of 0.4 mm to 0.8 mm. In another embodiment, the first layer 802a of the encapsulant 802 includes a thickness of 0.4 mm to 0.7 mm. In another embodiment, the first layer 802a of the encapsulant 802 includes a thickness of 0.4 mm to 0.6 mm. In another embodiment, the first layer 802a of the encapsulant 802 includes a thickness of 0.4 mm to 0.5 mm.

In an embodiment, the first layer 802a of the encapsulant 802 includes a thickness of 0.5 mm to 0.9 mm. In another embodiment, the first layer 802a of the encapsulant 802 includes a thickness of 0.5 mm to 0.8 mm. In another embodiment, the first layer 802a of the encapsulant 802 includes a thickness of 0.5 mm to 0.7 mm. In another embodiment, the first layer 802a of the encapsulant 802 includes a thickness of 0.5 mm to 0.6 mm. In an embodiment, the first layer 802a of the encapsulant 802 includes a thickness of 0.6 mm to 0.9 mm. In another embodiment, the first layer 802a of the encapsulant 802 includes a thickness of 0.6 mm to 0.8 mm. In another embodiment, the first layer 802a of the encapsulant 802 includes a thickness of 0.6 mm to 0.7 mm. In an embodiment, the first layer 802a of the encapsulant 802 includes a thickness of 0.7 mm to 0.9 mm. In another embodiment, the first layer 802a of the encapsulant 802 includes a thickness of 0.7 mm to 0.8 mm. In an embodiment, the first layer 802a of the encapsulant 802 includes a thickness of 0.8 mm to 0.9 mm.

In an embodiment, the second layer 802b of the encapsulant 802 includes a thickness of 0.2 mm to 0.9 mm. In another embodiment, the second layer 802b of the encapsulant 802 includes a thickness of 0.2 mm to 0.8 mm. In another embodiment, the second layer 802b of the encapsulant 802 includes a thickness of 0.2 mm to 0.7 mm. In another embodiment, the second layer 802b of the encapsulant 802 includes a thickness of 0.2 mm to 0.6 mm. In another embodiment, the second layer 802b of the encapsulant 802 includes a thickness of 0.2 mm to 0.5 mm. In another embodiment, the second layer 802b of the encapsulant 802 includes a thickness of 0.2 mm to 0.4 mm. In another embodiment, the second layer 802b of the encapsulant 802 includes a thickness of 0.2 mm to 0.3 mm.

In an embodiment, the second layer 802b of the encapsulant 802 includes a thickness of 0.3 mm to 0.9 mm. In another embodiment, the second layer 802b of the encapsulant 802 includes a thickness of 0.3 mm to 0.8 mm. In another embodiment, the second layer 802b of the encapsulant 802 includes a thickness of 0.3 mm to 0.7 mm. In another embodiment, the second layer 802b of the encapsulant 802 includes a thickness of 0.3 mm to 0.6 mm. In another embodiment, the second layer 802b of the encapsulant 802 includes a thickness of 0.3 mm to 0.5 mm. In another embodiment, the second layer 802b of the encapsulant 802 includes a thickness of 0.3 mm to 0.4 mm.

In an embodiment, the second layer 802b of the encapsulant 802 includes a thickness of 0.4 mm to 0.9 mm. In another embodiment, the second layer 802b of the encapsulant 802 includes a thickness of 0.4 mm to 0.8 mm. In another embodiment, the second layer 802b of the encapsulant 802 includes a thickness of 0.4 mm to 0.7 mm. In another embodiment, the second layer 802b of the encapsulant 802 includes a thickness of 0.4 mm to 0.6 mm. In another embodiment, the second layer 802b of the encapsulant 802 includes a thickness of 0.4 mm to 0.5 mm.

In an embodiment, the second layer 802b of the encapsulant 802 includes a thickness of 0.5 mm to 0.9 mm. In another embodiment, the second layer 802b of the encapsulant 802 includes a thickness of 0.5 mm to 0.8 mm. In another embodiment, the second layer 802b of the encapsulant 802 includes a thickness of 0.5 mm to 0.7 mm. In another embodiment, the second layer 802b of the encapsulant 802 includes a thickness of 0.5 mm to 0.6 mm. In an embodiment, the second layer 802b of the encapsulant 802 includes a thickness of 0.6 mm to 0.9 mm. In another embodiment, the second layer 802b of the encapsulant 802 includes a thickness of 0.6 mm to 0.8 mm. In another embodiment, the second layer 802b of the encapsulant 802 includes a thickness of 0.6 mm to 0.7 mm. In an embodiment, the second layer 802b of the encapsulant 802 includes a thickness of 0.7 mm to 0.9 mm. In another embodiment, the second layer 802b of the encapsulant 802 includes a thickness of 0.7 mm to 0.8 mm. In an embodiment, the second layer 802b of the encapsulant 802 includes a thickness of 0.8 mm to 0.9 mm.

In an embodiment, the thickness of the first layer 802a is equal to the thickness of the second layer 802b. In another embodiment, the thickness of the first layer 802a is different from the thickness of the second layer 802b.

In an embodiment, the frontsheet 803 includes a glass layer 804 and a polymer layer 805 attached to a first surface of the glass layer 804. In an embodiment, the frontsheet 803 is juxtaposed with the first layer 802a of the encapsulant 802. In an embodiment, each of the glass layer 804 and the polymer layer 805 is transparent. In an embodiment, the polymer layer 805 is attached to the glass layer 804 by an adhesive layer 806. In an embodiment, the adhesive layer 806 may include polyvinyl butyrate, acrylic, silicone, or polycarbonate. In another embodiment, the adhesive layer 806 may include pressure sensitive adhesives. In another embodiment, the polymer layer 805 is attached to the glass layer 804 by thermal bonding. In another embodiment, the frontsheet 803 includes at least one of the glass layer 804 or the polymer layer 805.

In an embodiment, the glass layer 804 includes a thickness of 2.5 mm to 4 mm. In another embodiment, the glass layer 804 includes a thickness of 2.5 mm to 3.5 mm. In another embodiment, the glass layer 804 includes a thickness of 2.5 mm to 3 mm. In another embodiment, the glass layer 804 includes a thickness of 3 mm to 4 mm. In another embodiment, the glass layer 804 includes a thickness of 3.5 mm to 4 mm. In another embodiment, the glass layer 804 includes a thickness of 2.6 mm to 3.5 mm. In another embodiment, the glass layer 804 includes a thickness of 2.7 mm to 3.5 mm. In another embodiment, the glass layer 804 includes a thickness of 2.8 mm to 3.5 mm. In another embodiment, the glass layer 804 includes a thickness of 2.9 mm to 3.5 mm. In another embodiment, the glass layer 804 includes a thickness of 3 mm to 3.5 mm. In another embodiment, the glass layer 804 includes a thickness of 3.1 mm to 3.5 mm. In another embodiment, the glass layer 804 includes a thickness of 3.2 mm to 3.5 mm. In another embodiment, the glass layer 804 includes a thickness of 3.3 mm to 3.5 mm. In another embodiment, the glass layer 804 includes a thickness of 3.4 mm to 3.5 mm. In another embodiment, the glass layer 804 includes a thickness of 2.5 mm to 3.4 mm. In another embodiment, the glass layer 804 includes a thickness of 2.5 mm to 3.3 mm. In another embodiment, the glass layer 804 includes a thickness of 2.5 mm to 3.2 mm. In another embodiment, the glass layer 804 includes a thickness of 2.5 mm to 3.1 mm. In another embodiment, the glass layer 804 includes a thickness of 2.5 mm to 2.9 mm. In another embodiment, the glass layer 804 includes a thickness of 2.5 mm to 2.8 mm. In another embodiment, the glass layer 804 includes a thickness of 2.5 mm to 2.7 mm. In another embodiment, the glass layer 804 includes a thickness of 2.5 mm to 2.6 mm.

In another embodiment, the glass layer 804 includes a thickness of 2.5 mm. In another embodiment, the glass layer 804 includes a thickness of 2.6 mm. In another embodiment, the glass layer 804 includes a thickness of 2.7 mm. In another embodiment, the glass layer 804 includes a thickness of 2.8 mm. In another embodiment, the glass layer 804 includes a thickness of 2.9 mm. In another embodiment, the glass layer 804 includes a thickness of 3 mm. In another embodiment, the glass layer 804 includes a thickness of 3.1 mm. In another embodiment, the glass layer 804 includes a thickness of 3.2 mm. In another embodiment, the glass layer 804 includes a thickness of 3.3 mm. In another embodiment, the glass layer 804 includes a thickness of 3.4 mm. In another embodiment, the glass layer 804 includes a thickness of 3.5 mm. In another embodiment, the glass layer 804 includes a thickness of 3.6 mm. In another embodiment, the glass layer 804 includes a thickness of 3.7 mm. In another embodiment, the glass layer 804 includes a thickness of 3.8 mm. In another embodiment, the glass layer 804 includes a thickness of 3.9 mm. In another embodiment, the glass layer 804 includes a thickness of 4 mm.

In an embodiment, the adhesive layer 806 includes thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof.

In an embodiment, the adhesive layer 806 includes a thickness of 1 μm to 900 μm. In an embodiment, the adhesive layer 806 includes a thickness of 1 μm to 900 μm. In an embodiment, the adhesive layer 806 includes a thickness of 1 μm to 850 μm. In an embodiment, the adhesive layer 806 includes a thickness of 1 μm to 800 μm. In an embodiment, the adhesive layer 806 includes a thickness of 1 μm to 750 μm. In an embodiment, the adhesive layer 806 includes a thickness of 1 μm to 700 μm. In an embodiment, the adhesive layer 806 includes a thickness of 1 μm to 650 μm. In an embodiment, the adhesive layer 806 includes a thickness of 1 μm to 600 μm. In an embodiment, the adhesive layer 806 includes a thickness of 1 μm to 550 μm. In an embodiment, the adhesive layer 806 includes a thickness of 1 μm to 500 μm. In an embodiment, the adhesive layer 806 includes a thickness of 1 μm to 450 μm. In an embodiment, the adhesive layer 806 includes a thickness of 1 μm to 400 μm. In an embodiment, the adhesive layer 806 includes a thickness of 1 μm to 350 μm. In an embodiment, the adhesive layer 806 includes a thickness of 1 μm to 300 μm. In an embodiment, the adhesive layer 806 includes a thickness of 1 μm to 250 μm. In an embodiment, the adhesive layer 806 includes a thickness of 1 μm to 200 μm. In an embodiment, the adhesive layer 806 includes a thickness of 1 μm to 150 μm. In an embodiment, the adhesive layer 806 includes a thickness of 1 μm to 100 μm. In an embodiment, the adhesive layer 806 includes a thickness of 1 μm to 50 μm.

In an embodiment, the adhesive layer 806 includes a thickness of 50 μm to 900 μm. In an embodiment, the adhesive layer 806 includes a thickness of 50 μm to 850 μm. In an embodiment, the adhesive layer 806 includes a thickness of 50 μm to 800 μm. In an embodiment, the adhesive layer 806 includes a thickness of 50 μm to 750 μm. In an embodiment, the adhesive layer 806 includes a thickness of 50 μm to 700 μm. In an embodiment, the adhesive layer 806 includes a thickness of 50 μm to 650 μm. In an embodiment, the adhesive layer 806 includes a thickness of 50 μm to 600

μm. In an embodiment, the adhesive layer 806 includes a thickness of 50 μm to 550 μm. In an embodiment, the adhesive layer 806 includes a thickness of 50 μm to 500 μm. In an embodiment, the adhesive layer 806 includes a thickness of 50 μm to 450 μm. In an embodiment, the adhesive layer 806 includes a thickness of 50 μm to 400 μm. In an embodiment, the adhesive layer 806 includes a thickness of 50 μm to 350 μm. In an embodiment, the adhesive layer 806 includes a thickness of 50 μm to 300 μm. In an embodiment, the adhesive layer 806 includes a thickness of 50 μm to 250 μm. In an embodiment, the adhesive layer 806 includes a thickness of 50 μm to 200 μm. In an embodiment, the adhesive layer 806 includes a thickness of 50 μm to 150 μm. In an embodiment, the adhesive layer 806 includes a thickness of 50 μm to 100 μm.

In an embodiment, the adhesive layer 806 includes a thickness of 100 μm to 900 μm. In an embodiment, the adhesive layer 806 includes a thickness of 100 μm to 850 μm. In an embodiment, the adhesive layer 806 includes a thickness of 100 μm to 800 μm. In an embodiment, the adhesive layer 806 includes a thickness of 100 μm to 750 μm. In an embodiment, the adhesive layer 806 includes a thickness of 100 μm to 700 μm. In an embodiment, the adhesive layer 806 includes a thickness of 100 μm to 650 μm. In an embodiment, the adhesive layer 806 includes a thickness of 100 μm to 600 μm. In an embodiment, the adhesive layer 806 includes a thickness of 100 μm to 550 μm. In an embodiment, the adhesive layer 806 includes a thickness of 100 μm to 500 μm. In an embodiment, the adhesive layer 806 includes a thickness of 100 μm to 450 μm. In an embodiment, the adhesive layer 806 includes a thickness of 100 μm to 400 μm. In an embodiment, the adhesive layer 806 includes a thickness of 100 μm to 350 μm. In an embodiment, the adhesive layer 806 includes a thickness of 100 μm to 300 μm. In an embodiment, the adhesive layer 806 includes a thickness of 100 μm to 250 μm. In an embodiment, the adhesive layer 806 includes a thickness of 100 μm to 200 μm. In an embodiment, the adhesive layer 806 includes a thickness of 100 μm to 150 μm.

In an embodiment, the adhesive layer 806 includes a thickness of 150 μm to 900 μm. In an embodiment, the adhesive layer 806 includes a thickness of 150 μm to 850 μm. In an embodiment, the adhesive layer 806 includes a thickness of 150 μm to 800 μm. In an embodiment, the adhesive layer 806 includes a thickness of 150 μm to 750 μm. In an embodiment, the adhesive layer 806 includes a thickness of 150 μm to 700 μm. In an embodiment, the adhesive layer 806 includes a thickness of 150 μm to 650 μm. In an embodiment, the adhesive layer 806 includes a thickness of 150 μm to 600 μm. In an embodiment, the adhesive layer 806 includes a thickness of 150 μm to 550 μm. In an embodiment, the adhesive layer 806 includes a thickness of 150 μm to 500 μm. In an embodiment, the adhesive layer 806 includes a thickness of 150 μm to 450 μm. In an embodiment, the adhesive layer 806 includes a thickness of 150 μm to 400 μm. In an embodiment, the adhesive layer 806 includes a thickness of 150 μm to 350 μm. In an embodiment, the adhesive layer 806 includes a thickness of 150 μm to 300 μm. In an embodiment, the adhesive layer 806 includes a thickness of 150 μm to 250 μm. In an embodiment, the adhesive layer 806 includes a thickness of 150 μm to 200 μm.

In an embodiment, the adhesive layer 806 includes a thickness of 200 μm to 900 μm. In an embodiment, the adhesive layer 806 includes a thickness of 200 μm to 850 μm. In an embodiment, the adhesive layer 806 includes a thickness of 200 μm to 800 μm. In an embodiment, the adhesive layer 806 includes a thickness of 200 μm to 750 μm. In an embodiment, the adhesive layer 806 includes a thickness of 200 μm to 700 μm. In an embodiment, the adhesive layer 806 includes a thickness of 200 μm to 650 μm. In an embodiment, the adhesive layer 806 includes a thickness of 200 μm to 600 μm. In an embodiment, the adhesive layer 806 includes a thickness of 200 μm to 550 μm. In an embodiment, the adhesive layer 806 includes a thickness of 200 μm to 500 μm. In an embodiment, the adhesive layer 806 includes a thickness of 200 μm to 450 μm. In an embodiment, the adhesive layer 806 includes a thickness of 200 μm to 400 μm. In an embodiment, the adhesive layer 806 includes a thickness of 200 μm to 350 μm. In an embodiment, the adhesive layer 806 includes a thickness of 200 μm to 300 μm. In an embodiment, the adhesive layer 806 includes a thickness of 200 μm to 250 μm.

In an embodiment, the adhesive layer 806 includes a thickness of 250 μm to 900 μm. In an embodiment, the adhesive layer 806 includes a thickness of 250 μm to 850 μm. In an embodiment, the adhesive layer 806 includes a thickness of 250 μm to 800 μm. In an embodiment, the adhesive layer 806 includes a thickness of 250 μm to 750 μm. In an embodiment, the adhesive layer 806 includes a thickness of 250 μm to 700 μm. In an embodiment, the adhesive layer 806 includes a thickness of 250 μm to 650 μm. In an embodiment, the adhesive layer 806 includes a thickness of 250 μm to 600 μm. In an embodiment, the adhesive layer 806 includes a thickness of 250 μm to 550 μm. In an embodiment, the adhesive layer 806 includes a thickness of 250 μm to 500 μm. In an embodiment, the adhesive layer 806 includes a thickness of 250 μm to 450 μm. In an embodiment, the adhesive layer 806 includes a thickness of 250 μm to 400 μm. In an embodiment, the adhesive layer 806 includes a thickness of 250 μm to 350 μm. In an embodiment, the adhesive layer 806 includes a thickness of 250 μm to 300 μm.

In an embodiment, the adhesive layer 806 includes a thickness of 300 μm to 900 μm. In an embodiment, the adhesive layer 806 includes a thickness of 300 μm to 850 μm. In an embodiment, the adhesive layer 806 includes a thickness of 300 μm to 800 μm. In an embodiment, the adhesive layer 806 includes a thickness of 300 μm to 750 μm. In an embodiment, the adhesive layer 806 includes a thickness of 300 μm to 700 μm. In an embodiment, the adhesive layer 806 includes a thickness of 300 μm to 650 μm. In an embodiment, the adhesive layer 806 includes a thickness of 300 μm to 600 μm. In an embodiment, the adhesive layer 806 includes a thickness of 300 μm to 550 μm. In an embodiment, the adhesive layer 806 includes a thickness of 300 μm to 500 μm. In an embodiment, the adhesive layer 806 includes a thickness of 300 μm to 450 μm. In an embodiment, the adhesive layer 806 includes a thickness of 300 μm to 400 μm. In an embodiment, the adhesive layer 806 includes a thickness of 300 μm to 350 μm.

In an embodiment, the adhesive layer 806 includes a thickness of 350 μm to 900 μm. In an embodiment, the adhesive layer 806 includes a thickness of 350 μm to 850 μm. In an embodiment, the adhesive layer 806 includes a thickness of 350 μm to 800 μm. In an embodiment, the adhesive layer 806 includes a thickness of 350 μm to 750 μm. In an embodiment, the adhesive layer 806 includes a thickness of 350 μm to 700 μm. In an embodiment, the adhesive layer 806 includes a thickness of 350 μm to 650 μm. In an embodiment, the adhesive layer 806 includes a thickness of 350 µm to 600 µm. In an embodiment, the adhesive layer 806 includes a thickness of 350 µm to 550 µm. In an embodiment, the adhesive layer 806 includes a thickness of 350 µm to 500 µm. In an embodiment, the adhesive layer 806 includes a thickness of 350 µm to 450 µm. In an embodiment, the adhesive layer 806 includes a thickness of 350 µm to 400 µm.

In an embodiment, the adhesive layer 806 includes a thickness of 400 µm to 900 µm. In an embodiment, the adhesive layer 806 includes a thickness of 400 µm to 850 µm. In an embodiment, the adhesive layer 806 includes a thickness of 400 µm to 800 µm. In an embodiment, the adhesive layer 806 includes a thickness of 400 µm to 750 µm. In an embodiment, the adhesive layer 806 includes a thickness of 400 µm to 700 µm. In an embodiment, the adhesive layer 806 includes a thickness of 400 µm to 650 µm. In an embodiment, the adhesive layer 806 includes a thickness of 400 µm to 600 µm. In an embodiment, the adhesive layer 806 includes a thickness of 400 µm to 550 µm. In an embodiment, the adhesive layer 806 includes a thickness of 400 µm to 500 µm. In an embodiment, the adhesive layer 806 includes a thickness of 400 µm to 450 µm.

In an embodiment, the adhesive layer 806 includes a thickness of 450 µm to 900 µm. In an embodiment, the adhesive layer 806 includes a thickness of 450 µm to 850 µm. In an embodiment, the adhesive layer 806 includes a thickness of 450 µm to 800 µm. In an embodiment, the adhesive layer 806 includes a thickness of 450 µm to 750 µm. In an embodiment, the adhesive layer 806 includes a thickness of 450 µm to 700 µm. In an embodiment, the adhesive layer 806 includes a thickness of 450 µm to 650 µm. In an embodiment, the adhesive layer 806 includes a thickness of 450 µm to 600 µm. In an embodiment, the adhesive layer 806 includes a thickness of 450 µm to 550 µm. In an embodiment, the adhesive layer 806 includes a thickness of 450 µm to 500 µm.

In an embodiment, the adhesive layer 806 includes a thickness of 500 µm to 900 µm. In an embodiment, the adhesive layer 806 includes a thickness of 500 µm to 850 µm. In an embodiment, the adhesive layer 806 includes a thickness of 500 µm to 800 µm. In an embodiment, the adhesive layer 806 includes a thickness of 500 µm to 750 µm. In an embodiment, the adhesive layer 806 includes a thickness of 500 µm to 700 µm. In an embodiment, the adhesive layer 806 includes a thickness of 500 µm to 650 µm. In an embodiment, the adhesive layer 806 includes a thickness of 500 µm to 600 µm. In an embodiment, the adhesive layer 806 includes a thickness of 500 µm to 550 µm.

In an embodiment, the adhesive layer 806 includes a thickness of 550 µm to 900 µm. In an embodiment, the adhesive layer 806 includes a thickness of 550 µm to 850 µm. In an embodiment, the adhesive layer 806 includes a thickness of 550 µm to 800 µm. In an embodiment, the adhesive layer 806 includes a thickness of 550 µm to 750 µm. In an embodiment, the adhesive layer 806 includes a thickness of 550 µm to 700 µm. In an embodiment, the adhesive layer 806 includes a thickness of 550 µm to 650 µm. In an embodiment, the adhesive layer 806 includes a thickness of 550 µm to 600 µm.

In an embodiment, the adhesive layer 806 includes a thickness of 600 µm to 900 µm. In an embodiment, the adhesive layer 806 includes a thickness of 600 µm to 850 µm. In an embodiment, the adhesive layer 806 includes a thickness of 600 µm to 800 µm. In an embodiment, the adhesive layer 806 includes a thickness of 600 µm to 750 µm. In an embodiment, the adhesive layer 806 includes a thickness of 600 µm to 700 µm. In an embodiment, the adhesive layer 806 includes a thickness of 600 µm to 650 µm.

In an embodiment, the adhesive layer 806 includes a thickness of 650 µm to 900 µm. In an embodiment, the adhesive layer 806 includes a thickness of 650 µm to 850 µm. In an embodiment, the adhesive layer 806 includes a thickness of 650 µm to 800 µm. In an embodiment, the adhesive layer 806 includes a thickness of 650 µm to 750 µm. In an embodiment, the adhesive layer 806 includes a thickness of 650 µm to 700 µm. In an embodiment, the adhesive layer 806 includes a thickness of 700 µm to 900 µm. In an embodiment, the adhesive layer 806 includes a thickness of 700 µm to 850 µm. In an embodiment, the adhesive layer 806 includes a thickness of 700 µm to 800 µm. In an embodiment, the adhesive layer 806 includes a thickness of 700 µm to 750 µm. In an embodiment, the adhesive layer 806 includes a thickness of 750 µm to 900 µm. In an embodiment, the adhesive layer 806 includes a thickness of 750 µm to 850 µm. In an embodiment, the adhesive layer 806 includes a thickness of 750 µm to 800 µm. In an embodiment, the adhesive layer 806 includes a thickness of 800 µm to 900 µm. In an embodiment, the adhesive layer 806 includes a thickness of 800 µm to 850 µm. In an embodiment, the adhesive layer 806 includes a thickness of 850 µm to 900 µm.

In an embodiment, the adhesive layer 806 includes a thickness of 1 µm. In an embodiment, the adhesive layer 806 includes a thickness of 50 µm. In an embodiment, the adhesive layer 806 includes a thickness of 100 µm. In an embodiment, the adhesive layer 806 includes a thickness of 1 µm. In an embodiment, the adhesive layer 806 includes a thickness of 150 µm. In an embodiment, the adhesive layer 806 includes a thickness of 200 µm. In an embodiment, the adhesive layer 806 includes a thickness of 250 µm. In an embodiment, the adhesive layer 806 includes a thickness of 300 µm. In an embodiment, the adhesive layer 806 includes a thickness of 350 µm. In an embodiment, the adhesive layer 806 includes a thickness of 400 µm. In an embodiment, the adhesive layer 806 includes a thickness of 450 µm. In an embodiment, the adhesive layer 806 includes a thickness of 500 µm. In an embodiment, the adhesive layer 806 includes a thickness of 550 µm. In an embodiment, the adhesive layer 806 includes a thickness of 600 µm. In an embodiment, the adhesive layer 806 includes a thickness of 650 µm. In an embodiment, the adhesive layer 806 includes a thickness of 700 µm. In an embodiment, the adhesive layer 806 includes a thickness of 750 µm. In an embodiment, the adhesive layer 806 includes a thickness of 800 µm. In an embodiment, the adhesive layer 806 includes a thickness of 850 µm. In an embodiment, the adhesive layer 806 includes a thickness of 900 µm.

In an embodiment, the polymer layer 805 includes a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In an embodiment, the frontsheet includes fluoropolymers, acrylics, polyesters, silicones, polycarbonates, or combinations thereof. In other embodiments, the polymer layer 805 includes polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide. In an embodiment, the polymer layer 805 includes a crosslinked polymeric material. In an embodiment, 50% to 99% of the polymer chains of the polymeric material are crosslinked.

In an embodiment, the polymer layer 805 includes a thickness of 0.01 mm to 0.5 mm. In another embodiment, the polymer layer 805 includes a thickness of 0.01 mm to 0.4 mm. In another embodiment, the polymer layer 805 includes a thickness of 0.01 mm to 0.3 mm. In another embodiment, the polymer layer 805 includes a thickness of 0.01 mm to 0.2 mm. In another embodiment, the polymer layer 805 includes a thickness of 0.01 mm to 0.1 mm. In another embodiment, the polymer layer 805 includes a thickness of 0.01 mm to 0.09 mm. In another embodiment, the polymer layer 805 includes a thickness of 0.01 mm to 0.08 mm. In another embodiment, the polymer layer 805 includes a thickness of 0.01 mm to 0.07 mm. In another embodiment, the polymer layer 805 includes a thickness of 0.01 mm to 0.06 mm. In another embodiment, the polymer layer 805 includes a thickness of 0.01 mm to 0.05 mm. In another embodiment, the polymer layer 805 includes a thickness of 0.01 mm to 0.04 mm. In another embodiment, the polymer layer 805 includes a thickness of 0.01 mm to 0.03 mm. In another embodiment, the polymer layer 805 includes a thickness of 0.01 mm to 0.02 mm.

In another embodiment, the polymer layer 805 includes a thickness of 0.01 mm to 0.4 mm. In another embodiment, the polymer layer 805 includes a thickness of 0.02 mm to 0.4 mm. In another embodiment, the polymer layer 805 includes a thickness of 0.03 mm to 0.4 mm. In another embodiment, the polymer layer 805 includes a thickness of 0.04 mm to 0.4 mm. In another embodiment, the polymer layer 805 includes a thickness of 0.05 mm to 0.4 mm. In another embodiment, the polymer layer 805 includes a thickness of 0.06 mm to 0.4 mm. In another embodiment, the polymer layer 805 includes a thickness of 0.07 mm to 0.4 mm. In another embodiment, the polymer layer 805 includes a thickness of 0.08 mm to 0.4 mm. In another embodiment, the polymer layer 805 includes a thickness of 0.09 mm to 0.4 mm. In another embodiment, the polymer layer 805 includes a thickness of 0.1 mm to 0.4 mm. In another embodiment, the polymer layer 805 includes a thickness of 0.15 mm to 0.4 mm. In another embodiment, the polymer layer 805 includes a thickness of 0.2 mm to 0.4 mm. In another embodiment, the polymer layer 805 includes a thickness of 0.25 mm to 0.4 mm. In another embodiment, the polymer layer 805 includes a thickness of 0.3 mm to 0.4 mm. In another embodiment, the polymer layer 805 includes a thickness of 0.35 mm to 0.4 mm.

In another embodiment, the polymer layer 805 includes a thickness of 0.025 mm to 0.1 mm. In another embodiment, the polymer layer 805 includes a thickness of 0.03 mm to 0.1 mm. In another embodiment, the polymer layer 805 includes a thickness of 0.035 mm to 0.1 mm. In another embodiment, the polymer layer 805 includes a thickness of 0.04 mm to 0.1 mm. In another embodiment, the polymer layer 805 includes a thickness of 0.045 mm to 0.1 mm. In another embodiment, the polymer layer 805 includes a thickness of 0.05 mm to 0.1 mm. In another embodiment, the polymer layer 805 includes a thickness of 0.06 mm to 0.1 mm. In another embodiment, the polymer layer 805 includes a thickness of 0.065 mm to 0.1 mm. In another embodiment, the polymer layer 805 includes a thickness of 0.07 mm to 0.1 mm. In another embodiment, the polymer layer 805 includes a thickness of 0.075 mm to 0.1 mm. In another embodiment, the polymer layer 805 includes a thickness of 0.08 mm to 0.1 mm. In another embodiment, the polymer layer 805 includes a thickness of 0.085 mm to 0.1 mm. In another embodiment, the polymer layer 805 includes a thickness of 0.09 mm to 0.1 mm. In another embodiment, the polymer layer 805 includes a thickness of 0.095 mm to 0.1 mm.

In an embodiment, a backsheet 807 is juxtaposed with the second layer 802b of the encapsulant 802. In an embodiment, the backsheet 807 includes thermoplastic polyolefin (TPO). In an embodiment, the backsheet 807 includes a single ply TPO roofing membrane. In other embodiments, non-limiting examples of TPO membranes are disclosed in U.S. Pat. No. 9,359,014 to Yang et al., which is incorporated by reference herein in its entirety. In another embodiment, the backsheet 807 includes polyvinyl chloride. In an embodiment, the backsheet 807 includes ethylene propylene diene monomer (EPDM) rubber. In an embodiment, the backsheet 807 includes a flame retardant additive. In some embodiments, the flame retardant additive may be clays, nanoclays, silicas, carbon black, metal hydroxides such as aluminum hydroxide, metal foils, graphite, and combinations thereof.

In an embodiment, a liner 808 is configured to form a plurality of indentations within the frontsheet 803. In an embodiment, the plurality of indentations is formed within the polymer layer 805 and the adhesive layer 806. In an embodiment, the liner 808 is a textured release liner including a plurality of dimples configured to form the plurality of indentations in the frontsheet 803. In an embodiment, the photovoltaic module 800 is laminated. In an embodiment, the liner 808 is configured to form the plurality of indentations within the frontsheet 803 during lamination of the photovoltaic module 800. In an embodiment, the liner 808 is removed after formation of the plurality of indentations.

In an embodiment, the liner 808 includes a thickness of 0.025 mm to 5 mm. In another embodiment, the liner 808 includes a thickness of 0.025 mm to 4 mm. In another embodiment, the liner 808 includes a thickness of 0.025 mm to 3 mm. In another embodiment, the liner 808 includes a thickness of 0.025 mm to 2 mm. In another embodiment, the liner 808 includes a thickness of 0.025 mm to 1 mm. In another embodiment, the liner 808 includes a thickness of 0.025 mm to 0.5 mm. In an embodiment, the liner 808 includes a thickness of 0.5 mm to 5 mm. In another embodiment, the liner 808 includes a thickness of 0.5 mm to 4 mm. In another embodiment, the liner 808 includes a thickness of 0.5 mm to 3 mm. In another embodiment, the liner 808 includes a thickness of 0.5 mm to 2 mm. In another embodiment, the liner 808 includes a thickness of 0.5 mm to 1 mm.

In an embodiment, the liner 808 includes a thickness of 1 mm to 5 mm. In another embodiment, the liner 808 includes a thickness of 1 mm to 5 mm. In another embodiment, the liner 808 includes a thickness of 1 mm to 4 mm. In another embodiment, the liner 808 includes a thickness of 1 mm to 3 mm. In another embodiment, the liner 808 includes a thickness of 1 mm to 2 mm. In another embodiment, the liner 808 includes a thickness of 2 mm to 5 mm. In another embodiment, the liner 808 includes a thickness of 2 mm to 4 mm. In another embodiment, the liner 808 includes a thickness of 2 mm to 3 mm. In another embodiment, the liner 808 includes a thickness of 3 mm to 5 mm. In another embodiment, the liner 808 includes a thickness of 3 mm to 4 mm. In another embodiment, the liner 808 includes a thickness of 4 mm to 5 mm.

Figure 10B:
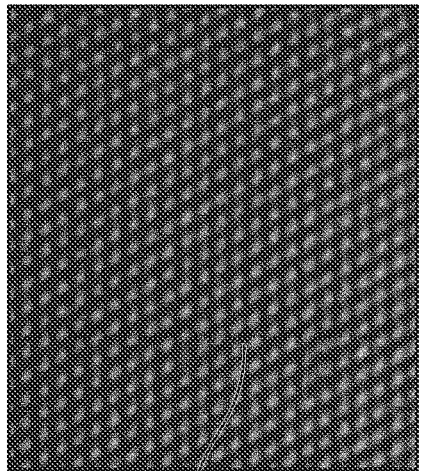
FIGS. 10A through 10D show embodiments of a textured release liner employed by the photovoltaic module shown in FIG. 9.
Figure 10D:
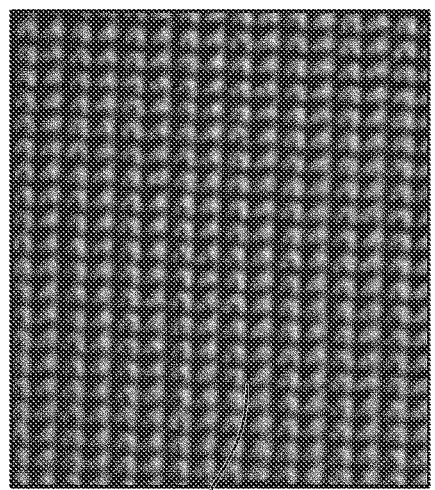
Figure 10A:
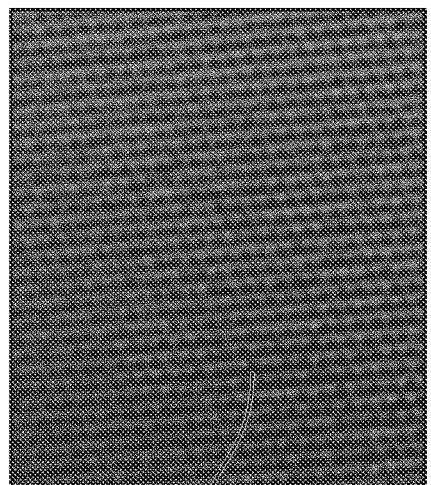

FIGS. 10A through 10D show embodiments of the liner 808. In an embodiment, FIG. 10A shows a textured liner 810 including a plurality of dimples (i.e., indentations) 811 formed within a surface thereof. In an embodiment, each of the dimples 811 includes a length of 0.95 mm to 1.1 mm. In an embodiment, a majority of the dimples 811 have a length of 0.95 mm to 1.1 mm. In an embodiment, each of the dimples 811 includes a length of 0.95 mm to 1.05 mm. In an embodiment, each of the dimples 811 includes a length of 0.95 mm to 1 mm. In an embodiment, each of the dimples 811 includes a length of 1 mm to 1.1 mm. In an embodiment, each of the dimples 811 includes a length of 1 mm to 1.05 mm. In an embodiment, each of the dimples 811 includes a length of 1.05 mm to 1.1 mm.

In an embodiment, each of the dimples 811 includes a length of 0.95 mm. In an embodiment, each of the dimples 811 includes a length of 0.96 mm. In an embodiment, each of the dimples 811 includes a length of 0.97 mm. In an embodiment, each of the dimples 811 includes a length of 0.98 mm. In an embodiment, each of the dimples 811 includes a length of 0.99 mm. In an embodiment, each of the dimples 811 includes a length of 1 mm. In an embodiment, each of the dimples 811 includes a length of 1.01 mm. In an embodiment, each of the dimples 811 includes a length of 1.02 mm. In an embodiment, each of the dimples 811 includes a length of 1.03 mm. In an embodiment, each of the dimples 811 includes a length of 1.04 mm. In an embodiment, each of the dimples 811 includes a length of 1.05 mm. In an embodiment, each of the dimples 811 includes a length of 1.06 mm. In an embodiment, each of the dimples 811 includes a length of 1.07 mm. In an embodiment, each of the dimples 811 includes a length of 1.08 mm. In an embodiment, each of the dimples 811 includes a length of 1.09 mm. In an embodiment, each of the dimples 811 includes a length of 1.1 mm.

In an embodiment, each of the dimples 811 includes a width of 1.95 mm to 2.1 mm. In an embodiment, a majority of the dimples 811 have a width of 1.95 mm to 2.1 mm. In an embodiment, each of the dimples 811 includes a width of 1.95 mm to 2 mm. In an embodiment, each of the dimples 811 includes a width of 2 mm to 2.1 mm. In an embodiment, each of the dimples 811 includes a width of 1.95 mm. In an embodiment, each of the dimples 811 includes a width of 1.96 mm. In an embodiment, each of the dimples 811 includes a width of 1.97 mm. In an embodiment, each of the dimples 811 includes a width of 1.98 mm. In an embodiment, each of the dimples 811 includes a width of 1.99 mm. In an embodiment, each of the dimples 811 includes a width of 2 mm. In an embodiment, each of the dimples 811 includes a width of 2.01 mm. In an embodiment, each of the dimples 811 includes a width of 2.02 mm. In an embodiment, each of the dimples 811 includes a width of 2.03 mm. In an embodiment, each of the dimples 811 includes a width of 2.04 mm. In an embodiment, each of the dimples 811 includes a width of 2.05 mm. In an embodiment, each of the dimples 811 includes a width of 2.06 mm. In an embodiment, each of the dimples 811 includes a width of 2.07 mm. In an embodiment, each of the dimples 811 includes a width of 2.08 mm. In an embodiment, each of the dimples 811 includes a width of 2.09 mm. In an embodiment, each of the dimples 811 includes a width of 2.1 mm.

In an embodiment, each of the dimples 811 includes a depth of 0.12 mm to 0.2 mm. In an embodiment, a majority of the dimples 811 have a depth of 0.12 mm to 0.2 mm. In an embodiment, each of the dimples 811 includes a depth of 0.12 mm to 0.19 mm. In an embodiment, each of the dimples 811 includes a depth of 0.12 mm to 0.18 mm. In an embodiment, each of the dimples 811 includes a depth of 0.12 mm to 0.17 mm. In an embodiment, each of the dimples 811 includes a depth of 0.12 mm to 0.16 mm. In an embodiment, each of the dimples 811 includes a depth of 0.12 mm to 0.15 mm. In an embodiment, each of the dimples 811 includes a depth of 0.12 mm to 0.14 mm. In an embodiment, each of the dimples 811 includes a depth of 0.12 mm to 0.13 mm.

In an embodiment, each of the dimples 811 includes a depth of 0.13 mm to 0.2 mm. In an embodiment, each of the dimples 811 includes a depth of 0.13 mm to 0.19 mm. In an embodiment, each of the dimples 811 includes a depth of 0.13 mm to 0.18 mm. In an embodiment, each of the dimples 811 includes a depth of 0.13 mm to 0.17 mm. In an embodiment, each of the dimples 811 includes a depth of 0.13 mm to 0.16 mm. In an embodiment, each of the dimples 811 includes a depth of 0.13 mm to 0.15 mm. In an embodiment, each of the dimples 811 includes a depth of 0.13 mm to 0.14 mm.

In an embodiment, each of the dimples 811 includes a depth of 0.14 mm to 0.2 mm. In an embodiment, each of the dimples 811 includes a depth of 0.14 mm to 0.19 mm. In an embodiment, each of the dimples 811 includes a depth of 0.14 mm to 0.18 mm. In an embodiment, each of the dimples 811 includes a depth of 0.14 mm to 0.17 mm. In an embodiment, each of the dimples 811 includes a depth of 0.14 mm to 0.16 mm. In an embodiment, each of the dimples 811 includes a depth of 0.14 mm to 0.15 mm. In an embodiment, each of the dimples 811 includes a depth of 0.15 mm to 0.2 mm. In an embodiment, each of the dimples 811 includes a depth of 0.15 mm to 0.19 mm. In an embodiment, each of the dimples 811 includes a depth of 0.15 mm to 0.18 mm. In an embodiment, each of the dimples 811 includes a depth of 0.15 mm to 0.17 mm. In an embodiment, each of the dimples 811 includes a depth of 0.15 mm to 0.16 mm.

In an embodiment, each of the dimples 811 includes a depth of 0.16 mm to 0.2 mm. In an embodiment, each of the dimples 811 includes a depth of 0.16 mm to 0.19 mm. In an embodiment, each of the dimples 811 includes a depth of 0.16 mm to 0.18 mm. In an embodiment, each of the dimples 811 includes a depth of 0.16 mm to 0.17 mm. In an embodiment, each of the dimples 811 includes a depth of 0.17 mm to 0.2 mm. In an embodiment, each of the dimples 811 includes a depth of 0.17 mm to 0.19 mm. In an embodiment, each of the dimples 811 includes a depth of 0.17 mm to 0.18 mm. In an embodiment, each of the dimples 811 includes a depth of 0.18 mm to 0.2 mm. In an embodiment, each of the dimples 811 includes a depth of 0.18 mm to 0.19 mm. In an embodiment, each of the dimples 811 includes a depth of 0.19 mm to 0.2 mm.

In an embodiment, each of the dimples 811 includes a depth of 0.12 mm. In an embodiment, each of the dimples 811 includes a depth of 0.13 mm. In an embodiment, each of the dimples 811 includes a depth of 0.14 mm. In an embodiment, each of the dimples 811 includes a depth of 0.15 mm. In an embodiment, each of the dimples 811 includes a depth of 0.155 mm. In an embodiment, each of the dimples 811 includes a depth of 0.16 mm. In an embodiment, each of the dimples 811 includes a depth of 0.17 mm. In an embodiment, each of the dimples 811 includes a depth of 0.18 mm. In an embodiment, each of the dimples 811 includes a depth of 0.19 mm.

In an embodiment, the liner 810 includes polytetrafluoroethylene (PTFE). In an embodiment, the liner 810 includes PTFE coated glass fabric. In an embodiment, the PTFE coated glass fabric is Steinbach AG PTFE fabric 345. In an embodiment, the liner 810 is configured to form within the frontsheet 803 a plurality of indentations having a size and shape corresponding to those of the plurality of dimples 811.

In an embodiment, FIG. 10B shows a liner 812 including a plurality of dimples 813 formed within a surface thereof. In an embodiment, each of the dimples 813 includes a length of 1.2 mm to 1.4 mm. In an embodiment, a majority of the dimples 813 have a length of 1.2 mm to 1.4 mm. In an embodiment, each of the dimples 813 includes a length of 1.2 mm to 1.3 mm. In an embodiment, each of the dimples 813 includes a length of 1.3 mm to 1.4 mm. In an embodiment, each of the dimples 813 includes a length of 1.2 mm. In an embodiment, each of the dimples 813 includes a length of 1.3 mm. In an embodiment, each of the dimples 813 includes a length of 1.31 mm. In an embodiment, each of the dimples 813 includes a length of 1.4 mm.

In an embodiment, each of the dimples 813 includes a width of 2.85 mm to 2.95 mm. In an embodiment, a majority of the dimples 813 have a width of 2.85 mm to 2.95 mm. In an embodiment, each of the dimples 813 includes a width of 2.85 mm to 2.9 mm. In an embodiment, each of the dimples 813 includes a width of 2.9 mm to 2.95 mm. In an embodiment, each of the dimples 813 includes a width of 2.85 mm. In an embodiment, each of the dimples 813 includes a width of 2.9 mm. In an embodiment, each of the dimples 813 includes a width of 2.95 mm.

In an embodiment, each of the dimples 813 includes a depth of 0.17 mm to 0.28 mm. In an embodiment, a majority of the dimples 813 have a depth of 0.17 mm to 0.28 mm. In an embodiment, each of the dimples 813 includes a depth of 0.17 mm to 0.27 mm. In an embodiment, each of the dimples 813 includes a depth of 0.17 mm to 0.26 mm. In an embodiment, each of the dimples 813 includes a depth of 0.17 mm to 0.25 mm. In an embodiment, each of the dimples 813 includes a depth of 0.17 mm to 0.24 mm. In an embodiment, each of the dimples 813 includes a depth of 0.17 mm to 0.23 mm. In an embodiment, each of the dimples 813 includes a depth of 0.17 mm to 0.22 mm. In an embodiment, each of the dimples 813 includes a depth of 0.17 mm to 0.21 mm. In an embodiment, each of the dimples 813 includes a depth of 0.17 mm to 0.2 mm. In an embodiment, each of the dimples 813 includes a depth of 0.17 mm to 0.19 mm. In an embodiment, each of the dimples 813 includes a depth of 0.17 mm to 0.18 mm.

In an embodiment, each of the dimples 813 includes a depth of 0.18 mm to 0.28 mm. In an embodiment, each of the dimples 813 includes a depth of 0.18 mm to 0.27 mm. In an embodiment, each of the dimples 813 includes a depth of 0.18 mm to 0.26 mm. In an embodiment, each of the dimples 813 includes a depth of 0.18 mm to 0.25 mm. In an embodiment, each of the dimples 813 includes a depth of 0.18 mm to 0.24 mm. In an embodiment, each of the dimples 813 includes a depth of 0.18 mm to 0.23 mm. In an embodiment, each of the dimples 813 includes a depth of 0.18 mm to 0.22 mm. In an embodiment, each of the dimples 813 includes a depth of 0.18 mm to 0.21 mm. In an embodiment, each of the dimples 813 includes a depth of 0.18 mm to 0.2 mm. In an embodiment, each of the dimples 813 includes a depth of 0.18 mm to 0.19 mm.

In an embodiment, each of the dimples 813 includes a depth of 0.19 mm to 0.28 mm. In an embodiment, each of the dimples 813 includes a depth of 0.19 mm to 0.27 mm. In an embodiment, each of the dimples 813 includes a depth of 0.19 mm to 0.26 mm. In an embodiment, each of the dimples 813 includes a depth of 0.19 mm to 0.25 mm. In an embodiment, each of the dimples 813 includes a depth of 0.19 mm to 0.24 mm. In an embodiment, each of the dimples 813 includes a depth of 0.19 mm to 0.23 mm. In an embodiment, each of the dimples 813 includes a depth of 0.19 mm to 0.22 mm. In an embodiment, each of the dimples 813 includes a depth of 0.19 mm to 0.21 mm. In an embodiment, each of the dimples 813 includes a depth of 0.19 mm to 0.2 mm.

In an embodiment, each of the dimples 813 includes a depth of 0.2 mm to 0.28 mm. In an embodiment, each of the dimples 813 includes a depth of 0.2 mm to 0.27 mm. In an embodiment, each of the dimples 813 includes a depth of 0.2 mm to 0.26 mm. In an embodiment, each of the dimples 813 includes a depth of 0.2 mm to 0.25 mm. In an embodiment, each of the dimples 813 includes a depth of 0.2 mm to 0.24 mm. In an embodiment, each of the dimples 813 includes a depth of 0.2 mm to 0.23 mm. In an embodiment, each of the dimples 813 includes a depth of 0.2 mm to 0.22 mm. In an embodiment, each of the dimples 813 includes a depth of 0.2 mm to 0.21 mm.

In an embodiment, each of the dimples 813 includes a depth of 0.21 mm to 0.28 mm. In an embodiment, each of the dimples 813 includes a depth of 0.21 mm to 0.27 mm. In an embodiment, each of the dimples 813 includes a depth of 0.21 mm to 0.26 mm. In an embodiment, each of the dimples 813 includes a depth of 0.21 mm to 0.25 mm. In an embodiment, each of the dimples 813 includes a depth of 0.21 mm to 0.24 mm. In an embodiment, each of the dimples 813 includes a depth of 0.21 mm to 0.23 mm. In an embodiment, each of the dimples 813 includes a depth of 0.21 mm to 0.22 mm.

In an embodiment, each of the dimples 813 includes a depth of 0.22 mm to 0.28 mm. In an embodiment, each of the dimples 813 includes a depth of 0.22 mm to 0.27 mm. In an embodiment, each of the dimples 813 includes a depth of 0.22 mm to 0.26 mm. In an embodiment, each of the dimples 813 includes a depth of 0.22 mm to 0.25 mm. In an embodiment, each of the dimples 813 includes a depth of 0.22 mm to 0.24 mm. In an embodiment, each of the dimples 813 includes a depth of 0.22 mm to 0.23 mm. In an embodiment, each of the dimples 813 includes a depth of 0.23 mm to 0.28 mm. In an embodiment, each of the dimples 813 includes a depth of 0.23 mm to 0.27 mm. In an embodiment, each of the dimples 813 includes a depth of 0.23 mm to 0.26 mm. In an embodiment, each of the dimples 813 includes a depth of 0.23 mm to 0.25 mm. In an embodiment, each of the dimples 813 includes a depth of 0.23 mm to 0.24 mm.

In an embodiment, each of the dimples 813 includes a depth of 0.24 mm to 0.28 mm. In an embodiment, each of the dimples 813 includes a depth of 0.24 mm to 0.27 mm. In an embodiment, each of the dimples 813 includes a depth of 0.24 mm to 0.26 mm. In an embodiment, each of the dimples 813 includes a depth of 0.24 mm to 0.25 mm. In an embodiment, each of the dimples 813 includes a depth of 0.25 mm to 0.28 mm. In an embodiment, each of the dimples 813 includes a depth of 0.25 mm to 0.27 mm. In an embodiment, each of the dimples 813 includes a depth of 0.25 mm to 0.26 mm. In an embodiment, each of the dimples 813 includes a depth of 0.26 mm to 0.28 mm. In an embodiment, each of the dimples 813 includes a depth of 0.26 mm to 0.27 mm. In an embodiment, each of the dimples 813 includes a depth of 0.27 mm to 0.28 mm.

In an embodiment, each of the dimples 813 includes a depth of 0.17 mm. In an embodiment, each of the dimples 813 includes a depth of 0.18 mm. In an embodiment, each of the dimples 813 includes a depth of 0.19 mm. In an embodiment, each of the dimples 813 includes a depth of 0.2 mm. In an embodiment, each of the dimples 813 includes a depth of 0.21 mm. In an embodiment, each of the dimples 813 includes a depth of 0.22 mm. In an embodiment, each of the dimples 813 includes a depth of 0.227 mm. In an embodiment, each of the dimples 813 includes a depth of 0.23 mm. In an embodiment, each of the dimples 813 includes a depth of 0.24 mm. In an embodiment, each of the dimples 813 includes a depth of 0.25 mm. In an embodiment, each of the dimples 813 includes a depth of 0.26 mm. In an embodiment, each of the dimples 813 includes a depth of 0.27 mm. In an embodiment, each of the dimples 813 includes a depth of 0.28 mm.

In an embodiment, the liner 812 includes polytetrafluoroethylene (PTFE). In an embodiment, the liner 812 includes PTFE transport and release sheet. In an embodiment, the PTFE transport and release sheet is Steinbach AG PTFE Type 5307. In an embodiment, the liner 812 is configured to form within the frontsheet 803 a plurality of indentations having a size and shape corresponding to those of the plurality of dimples 813.

Figure 10C:
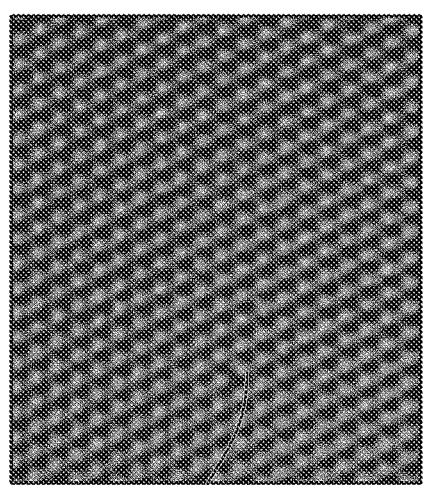

In an embodiment, FIG. 10C shows a liner 814 including a plurality of dimples 815 formed within a surface thereof. In an embodiment, each of the dimples 815 includes a length of 1.44 mm to 1.52 mm. In an embodiment, a majority of the dimples 815 have a length of 1.44 mm to 1.52 mm. In an embodiment, each of the dimples 815 includes a length of 1.44 mm to 1.51 mm. In an embodiment, each of the dimples 815 includes a length of 1.44 mm to 1.5 mm. In an embodiment, each of the dimples 815 includes a length of 1.44 mm to 1.49 mm. In an embodiment, each of the dimples 815 includes a length of 1.44 mm to 1.48 mm. In an embodiment, each of the dimples 815 includes a length of 1.44 mm to 1.47 mm. In an embodiment, each of the dimples 815 includes a length of 1.44 mm to 1.46 mm. In an embodiment, each of the dimples 815 includes a length of 1.44 mm to 1.45 mm.

In an embodiment, each of the dimples 815 includes a length of 1.45 mm to 1.52 mm. In an embodiment, each of the dimples 815 includes a length of 1.45 mm to 1.51 mm. In an embodiment, each of the dimples 815 includes a length of 1.45 mm to 1.5 mm. In an embodiment, each of the dimples 815 includes a length of 1.45 mm to 1.49 mm. In an embodiment, each of the dimples 815 includes a length of 1.45 mm to 1.48 mm. In an embodiment, each of the dimples 815 includes a length of 1.45 mm to 1.47 mm. In an embodiment, each of the dimples 815 includes a length of 1.45 mm to 1.46 mm.

In an embodiment, each of the dimples 815 includes a length of 1.46 mm to 1.52 mm. In an embodiment, each of the dimples 815 includes a length of 1.46 mm to 1.51 mm. In an embodiment, each of the dimples 815 includes a length of 1.46 mm to 1.5 mm. In an embodiment, each of the dimples 815 includes a length of 1.46 mm to 1.49 mm. In an embodiment, each of the dimples 815 includes a length of 1.46 mm to 1.48 mm. In an embodiment, each of the dimples 815 includes a length of 1.46 mm to 1.47 mm. In an embodiment, each of the dimples 815 includes a length of 1.47 mm to 1.52 mm. In an embodiment, each of the dimples 815 includes a length of 1.47 mm to 1.51 mm. In an embodiment, each of the dimples 815 includes a length of 1.47 mm to 1.5 mm. In an embodiment, each of the dimples 815 includes a length of 1.47 mm to 1.49 mm. In an embodiment, each of the dimples 815 includes a length of 1.47 mm to 1.48 mm.

In an embodiment, each of the dimples 815 includes a length of 1.48 mm to 1.52 mm. In an embodiment, each of the dimples 815 includes a length of 1.48 mm to 1.51 mm. In an embodiment, each of the dimples 815 includes a length of 1.48 mm to 1.5 mm. In an embodiment, each of the dimples 815 includes a length of 1.48 mm to 1.49 mm. In an embodiment, each of the dimples 815 includes a length of 1.49 mm to 1.52 mm. In an embodiment, each of the dimples 815 includes a length of 1.49 mm to 1.51 mm. In an embodiment, each of the dimples 815 includes a length of 1.49 mm to 1.5 mm. In an embodiment, each of the dimples 815 includes a length of 1.5 mm to 1.52 mm. In an embodiment, each of the dimples 815 includes a length of 1.5 mm to 1.51 mm. In an embodiment, each of the dimples 815 includes a length of 1.51 mm to 1.52 mm.

In an embodiment, each of the dimples 815 includes a length of 1.44 mm. In an embodiment, each of the dimples 815 includes a length of 1.45 mm. In an embodiment, each of the dimples 815 includes a length of 1.46 mm. In an embodiment, each of the dimples 815 includes a length of 1.47 mm. In an embodiment, each of the dimples 815 includes a length of 1.48 mm. In an embodiment, each of the dimples 815 includes a length of 1.49 mm. In an embodiment, each of the dimples 815 includes a length of 1.5 mm. In an embodiment, each of the dimples 815 includes a length of 1.51 mm. In an embodiment, each of the dimples 815 includes a length of 1.52 mm.

In an embodiment, each of the dimples 815 includes a width of 3.19 mm to 3.24 mm. In an embodiment, a majority of the dimples 815 have a width of 3.19 mm to 3.24 mm. In an embodiment, each of the dimples 815 includes a width of 3.19 mm to 3.23 mm. In an embodiment, each of the dimples 815 includes a width of 3.19 mm to 3.22 mm. In an embodiment, each of the dimples 815 includes a width of 3.19 mm to 3.21 mm. In an embodiment, each of the dimples 815 includes a width of 3.19 mm to 3.20 mm. In an embodiment, each of the dimples 815 includes a width of 3.2 mm to 3.24 mm. In an embodiment, each of the dimples 815 includes a width of 3.2 mm to 3.23 mm. In an embodiment, each of the dimples 815 includes a width of 3.2 mm to 3.22 mm. In an embodiment, each of the dimples 815 includes a width of 3.2 mm to 3.21 mm. In an embodiment, each of the dimples 815 includes a width of 3.21 mm to 3.24 mm. In an embodiment, each of the dimples 815 includes a width of 3.21 mm to 3.23 mm. In an embodiment, each of the dimples 815 includes a width of 3.21 mm to 3.22 mm. In an embodiment, each of the dimples 815 includes a width of 3.22 mm to 3.24 mm. In an embodiment, each of the dimples 815 includes a width of 3.22 mm to 3.23 mm. In an embodiment, each of the dimples 815 includes a width of 3.23 mm to 3.24 mm.

In an embodiment, each of the dimples 815 includes a width of 3.19 mm. In an embodiment, each of the dimples 815 includes a width of 3.2 mm. In an embodiment, each of the dimples 815 includes a width of 3.21 mm. In an embodiment, each of the dimples 815 includes a width of 3.22 mm. In an embodiment, each of the dimples 815 includes a width of 3.23 mm. In an embodiment, each of the dimples 815 includes a width of 3.24 mm.

In an embodiment, each of the dimples 815 includes a depth of 0.19 mm to 0.32 mm. In an embodiment, a majority of the dimples 815 have a depth of 0.19 mm to 0.32 mm. In an embodiment, each of the dimples 815 includes a depth of 0.19 mm to 0.31 mm. In an embodiment, each of the dimples 815 includes a depth of 0.19 mm to 0.3 mm. In an embodiment, each of the dimples 815 includes a depth of 0.19 mm to 0.29 mm. In an embodiment, each of the dimples 815 includes a depth of 0.19 mm to 0.28 mm. In an embodiment, each of the dimples 815 includes a depth of 0.19 mm to 0.27 mm. In an embodiment, each of the dimples 815 includes a depth of 0.19 mm to 0.26 mm. In an embodiment, each of the dimples 815 includes a depth of 0.19 mm to 0.25 mm. In an embodiment, each of the dimples 815 includes a depth of 0.19 mm to 0.24 mm. In an embodiment, each of the dimples 815 includes a depth of 0.19 mm to 0.23 mm. In an embodiment, each of the dimples 815 includes a depth of 0.19 mm to 0.22 mm. In an embodiment, each of the dimples 815 includes a depth of 0.19 mm to 0.21 mm. In an embodiment, each of the dimples 815 includes a depth of 0.19 mm to 0.2 mm.

In an embodiment, each of the dimples 815 includes a depth of 0.2 mm to 0.32 mm. In an embodiment, each of the dimples 815 includes a depth of 0.2 mm to 0.31 mm. In an embodiment, each of the dimples 815 includes a depth of 0.2 mm to 0.3 mm. In an embodiment, each of the dimples 815 includes a depth of 0.2 mm to 0.29 mm. In an embodiment, each of the dimples 815 includes a depth of 0.2 mm to 0.28 mm. In an embodiment, each of the dimples 815 includes a depth of 0.2 mm to 0.27 mm. In an embodiment, each of the dimples 815 includes a depth of 0.2 mm to 0.26 mm. In an embodiment, each of the dimples 815 includes a depth of 0.2 mm to 0.25 mm. In an embodiment, each of the dimples 815 includes a depth of 0.2 mm to 0.24 mm. In an embodiment, each of the dimples 815 includes a depth of 0.2 mm to 0.23 mm. In an embodiment, each of the dimples 815 includes a depth of 0.2 mm to 0.22 mm. In an embodiment, each of the dimples 815 includes a depth of 0.2 mm to 0.21 mm.

In an embodiment, each of the dimples 815 includes a depth of 0.21 mm to 0.32 mm. In an embodiment, each of the dimples 815 includes a depth of 0.21 mm to 0.31 mm. In an embodiment, each of the dimples 815 includes a depth of 0.21 mm to 0.3 mm. In an embodiment, each of the dimples 815 includes a depth of 0.21 mm to 0.29 mm. In an embodiment, each of the dimples 815 includes a depth of 0.21 mm to 0.28 mm. In an embodiment, each of the dimples 815 includes a depth of 0.21 mm to 0.27 mm. In an embodiment, each of the dimples 815 includes a depth of 0.21 mm to 0.26 mm. In an embodiment, each of the dimples 815 includes a depth of 0.21 mm to 0.25 mm. In an embodiment, each of the dimples 815 includes a depth of 0.21 mm to 0.24 mm. In an embodiment, each of the dimples 815 includes a depth of 0.21 mm to 0.23 mm. In an embodiment, each of the dimples 815 includes a depth of 0.21 mm to 0.22 mm.

In an embodiment, each of the dimples 815 includes a depth of 0.22 mm to 0.32 mm. In an embodiment, each of the dimples 815 includes a depth of 0.22 mm to 0.31 mm. In an embodiment, each of the dimples 815 includes a depth of 0.22 mm to 0.3 mm. In an embodiment, each of the dimples 815 includes a depth of 0.22 mm to 0.29 mm. In an embodiment, each of the dimples 815 includes a depth of 0.22 mm to 0.28 mm. In an embodiment, each of the dimples 815 includes a depth of 0.22 mm to 0.27 mm. In an embodiment, each of the dimples 815 includes a depth of 0.22 mm to 0.26 mm. In an embodiment, each of the dimples 815 includes a depth of 0.22 mm to 0.25 mm. In an embodiment, each of the dimples 815 includes a depth of 0.22 mm to 0.24 mm. In an embodiment, each of the dimples 815 includes a depth of 0.22 mm to 0.23 mm.

In an embodiment, each of the dimples 815 includes a depth of 0.23 mm to 0.32 mm. In an embodiment, each of the dimples 815 includes a depth of 0.23 mm to 0.31 mm. In an embodiment, each of the dimples 815 includes a depth of 0.23 mm to 0.3 mm. In an embodiment, each of the dimples 815 includes a depth of 0.23 mm to 0.29 mm. In an embodiment, each of the dimples 815 includes a depth of 0.23 mm to 0.28 mm. In an embodiment, each of the dimples 815 includes a depth of 0.23 mm to 0.27 mm. In an embodiment, each of the dimples 815 includes a depth of 0.23 mm to 0.26 mm. In an embodiment, each of the dimples 815 includes a depth of 0.23 mm to 0.25 mm. In an embodiment, each of the dimples 815 includes a depth of 0.23 mm to 0.24 mm.

In an embodiment, each of the dimples 815 includes a depth of 0.24 mm to 0.32 mm. In an embodiment, each of the dimples 815 includes a depth of 0.24 mm to 0.31 mm. In an embodiment, each of the dimples 815 includes a depth of 0.24 mm to 0.3 mm. In an embodiment, each of the dimples 815 includes a depth of 0.24 mm to 0.29 mm. In an embodiment, each of the dimples 815 includes a depth of 0.24 mm to 0.28 mm. In an embodiment, each of the dimples 815 includes a depth of 0.24 mm to 0.27 mm. In an embodiment, each of the dimples 815 includes a depth of 0.24 mm to 0.26 mm. In an embodiment, each of the dimples 815 includes a depth of 0.24 mm to 0.25 mm.

In an embodiment, each of the dimples 815 includes a depth of 0.25 mm to 0.32 mm. In an embodiment, each of the dimples 815 includes a depth of 0.25 mm to 0.31 mm. In an embodiment, each of the dimples 815 includes a depth of 0.25 mm to 0.3 mm. In an embodiment, each of the dimples 815 includes a depth of 0.25 mm to 0.29 mm. In an embodiment, each of the dimples 815 includes a depth of 0.25 mm to 0.28 mm. In an embodiment, each of the dimples 815 includes a depth of 0.25 mm to 0.27 mm. In an embodiment, each of the dimples 815 includes a depth of 0.25 mm to 0.26 mm.

In an embodiment, each of the dimples 815 includes a depth of 0.26 mm to 0.32 mm. In an embodiment, each of the dimples 815 includes a depth of 0.26 mm to 0.31 mm. In an embodiment, each of the dimples 815 includes a depth of 0.26 mm to 0.3 mm. In an embodiment, each of the dimples 815 includes a depth of 0.26 mm to 0.29 mm. In an embodiment, each of the dimples 815 includes a depth of 0.26 mm to 0.28 mm. In an embodiment, each of the dimples 815 includes a depth of 0.26 mm to 0.27 mm.

In an embodiment, each of the dimples 815 includes a depth of 0.27 mm to 0.32 mm. In an embodiment, each of the dimples 815 includes a depth of 0.27 mm to 0.31 mm. In an embodiment, each of the dimples 815 includes a depth of 0.27 mm to 0.3 mm. In an embodiment, each of the dimples 815 includes a depth of 0.27 mm to 0.29 mm. In an embodiment, each of the dimples 815 includes a depth of 0.27 mm to 0.28 mm. In an embodiment, each of the dimples 815 includes a depth of 0.28 mm to 0.32 mm. In an embodiment, each of the dimples 815 includes a depth of 0.28 mm to 0.31 mm. In an embodiment, each of the dimples 815 includes a depth of 0.28 mm to 0.3 mm. In an embodiment, each of the dimples 815 includes a depth of 0.28 mm to 0.29 mm.

In an embodiment, each of the dimples 815 includes a depth of 0.29 mm to 0.32 mm. In an embodiment, each of the dimples 815 includes a depth of 0.29 mm to 0.31 mm. In an embodiment, each of the dimples 815 includes a depth of 0.29 mm to 0.3 mm. In an embodiment, each of the dimples 815 includes a depth of 0.3 mm to 0.32 mm. In an embodiment, each of the dimples 815 includes a depth of 0.3 mm to 0.31 mm. In an embodiment, each of the dimples 815 includes a depth of 0.31 mm to 0.32 mm.

In an embodiment, each of the dimples 815 includes a depth of 0.19 mm. In an embodiment, each of the dimples 815 includes a depth of 0.2 mm. In an embodiment, each of the dimples 815 includes a depth of 0.21 mm. In an embodiment, each of the dimples 815 includes a depth of 0.22 mm. In an embodiment, each of the dimples 815 includes a depth of 0.23 mm. In an embodiment, each of the dimples 815 includes a depth of 0.24 mm. In an embodiment, each of the dimples 815 includes a depth of 0.25 mm.

In an embodiment, each of the dimples 815 includes a depth of 0.252 mm. In an embodiment, each of the dimples 815 includes a depth of 0.26 mm. In an embodiment, each of the dimples 815 includes a depth of 0.27 mm. In an embodiment, each of the dimples 815 includes a depth of 0.28 mm. In an embodiment, each of the dimples 815 includes a depth of 0.29 mm. In an embodiment, each of the dimples 815 includes a depth of 0.3 mm. In an embodiment, each of the dimples 815 includes a depth of 0.31 mm. In an embodiment, each of the dimples 815 includes a depth of 0.32 mm.

In an embodiment, the liner 814 includes polymer coated fiber reinforced membrane. In an embodiment, the line 814 is a polytetrafluoroethylene (PTFE) coated fiber reinforced membrane. In an embodiment, the liner 814 is Xiya A membrane. In an embodiment, the liner 814 is configured to form within the frontsheet 803 a plurality of indentations having a size and shape corresponding to those of the plurality of dimples 815.

In an embodiment, FIG. 10D shows a liner 816 including a plurality of dimples 817 formed within a surface thereof. In an embodiment, each of the dimples 817 includes a length of 1.85 mm to 1.95 mm. In an embodiment, a majority of the dimples 817 have a length of 1.85 mm to 1.95 mm. In an embodiment, each of the dimples 817 includes a length of 1.85 mm to 1.94 mm. In an embodiment, each of the dimples 817 includes a length of 1.85 mm to 1.93 mm. In an embodiment, each of the dimples 817 includes a length of 1.85 mm to 1.92 mm. In an embodiment, each of the dimples 817 includes a length of 1.85 mm to 1.91 mm. In an embodiment, each of the dimples 817 includes a length of 1.85 mm to 1.9 mm. In an embodiment, each of the dimples 817 includes a length of 1.85 mm to 1.89 mm. In an embodiment, each of the dimples 817 includes a length of 1.85 mm to 1.88 mm. In an embodiment, each of the dimples 817 includes a length of 1.85 mm to 1.87 mm. In an embodiment, each of the dimples 817 includes a length of 1.85 mm to 1.86 mm.

In an embodiment, each of the dimples 817 includes a length of 1.86 mm to 1.95 mm. In an embodiment, each of the dimples 817 includes a length of 1.86 mm to 1.94 mm. In an embodiment, each of the dimples 817 includes a length of 1.86 mm to 1.93 mm. In an embodiment, each of the dimples 817 includes a length of 1.86 mm to 1.92 mm. In an embodiment, each of the dimples 817 includes a length of 1.86 mm to 1.91 mm. In an embodiment, each of the dimples 817 includes a length of 1.86 mm to 1.9 mm. In an embodiment, each of the dimples 817 includes a length of 1.86 mm to 1.89 mm. In an embodiment, each of the dimples 817 includes a length of 1.86 mm to 1.88 mm. In an embodiment, each of the dimples 817 includes a length of 1.86 mm to 1.87 mm.

In an embodiment, each of the dimples 817 includes a length of 1.87 mm to 1.95 mm. In an embodiment, each of the dimples 817 includes a length of 1.87 mm to 1.94 mm. In an embodiment, each of the dimples 817 includes a length of 1.87 mm to 1.93 mm. In an embodiment, each of the dimples 817 includes a length of 1.87 mm to 1.92 mm. In an embodiment, each of the dimples 817 includes a length of 1.87 mm to 1.91 mm. In an embodiment, each of the dimples 817 includes a length of 1.87 mm to 1.9 mm. In an embodiment, each of the dimples 817 includes a length of 1.87 mm to 1.89 mm. In an embodiment, each of the dimples 817 includes a length of 1.87 mm to 1.88 mm.

In an embodiment, each of the dimples 817 includes a length of 1.88 mm to 1.95 mm. In an embodiment, each of the dimples 817 includes a length of 1.88 mm to 1.94 mm. In an embodiment, each of the dimples 817 includes a length of 1.88 mm to 1.93 mm. In an embodiment, each of the dimples 817 includes a length of 1.88 mm to 1.92 mm. In an embodiment, each of the dimples 817 includes a length of 1.88 mm to 1.91 mm. In an embodiment, each of the dimples 817 includes a length of 1.88 mm to 1.9 mm. In an embodiment, each of the dimples 817 includes a length of 1.88 mm to 1.89 mm.

In an embodiment, each of the dimples 817 includes a length of 1.89 mm to 1.95 mm. In an embodiment, each of the dimples 817 includes a length of 1.89 mm to 1.94 mm. In an embodiment, each of the dimples 817 includes a length of 1.89 mm to 1.93 mm. In an embodiment, each of the dimples 817 includes a length of 1.89 mm to 1.92 mm. In an embodiment, each of the dimples 817 includes a length of 1.89 mm to 1.91 mm. In an embodiment, each of the dimples 817 includes a length of 1.89 mm to 1.9 mm. In an embodiment, each of the dimples 817 includes a length of 1.9 mm to 1.95 mm. In an embodiment, each of the dimples 817 includes a length of 1.9 mm to 1.94 mm. In an embodiment, each of the dimples 817 includes a length of 1.9 mm to 1.93 mm. In an embodiment, each of the dimples 817 includes a length of 1.9 mm to 1.92 mm. In an embodiment, each of the dimples 817 includes a length of 1.9 mm to 1.91 mm.

In an embodiment, each of the dimples 817 includes a length of 1.91 mm to 1.95 mm. In an embodiment, each of the dimples 817 includes a length of 1.91 mm to 1.94 mm. In an embodiment, each of the dimples 817 includes a length of 1.91 mm to 1.93 mm. In an embodiment, each of the dimples 817 includes a length of 1.91 mm to 1.92 mm. In an embodiment, each of the dimples 817 includes a length of 1.92 mm to 1.95 mm. In an embodiment, each of the dimples 817 includes a length of 1.92 mm to 1.94 mm. In an embodiment, each of the dimples 817 includes a length of 1.92 mm to 1.93 mm. In an embodiment, each of the dimples 817 includes a length of 1.93 mm to 1.95 mm. In an embodiment, each of the dimples 817 includes a length of 1.93 mm to 1.94 mm. In an embodiment, each of the dimples 817 includes a length of 1.94 mm to 1.95 mm.

In an embodiment, each of the dimples 817 includes a length of 1.85 mm. In an embodiment, each of the dimples 817 includes a length of 1.86 mm. In an embodiment, each of the dimples 817 includes a length of 1.87 mm. In an embodiment, each of the dimples 817 includes a length of 1.88 mm. In an embodiment, each of the dimples 817 includes a length of 1.89 mm. In an embodiment, each of the dimples 817 includes a length of 1.9 mm. In an embodiment, each of the dimples 817 includes a length of 1.91 mm. In an embodiment, each of the dimples 817 includes a length of 1.92 mm. In an embodiment, each of the dimples 817 includes a length of 1.93 mm. In an embodiment, each of the dimples 817 includes a length of 1.94 mm. In an embodiment, each of the dimples 817 includes a length of 1.95 mm.

In an embodiment, each of the dimples 817 includes a width of 1 mm to 1.7 mm. In an embodiment, a majority of the dimples 817 have a width of 1 mm to 1.7 mm. In an embodiment, each of the dimples 817 includes a width of 1 mm to 1.6 mm. In an embodiment, each of the dimples 817 includes a width of 1 mm to 1.5 mm. In an embodiment, each of the dimples 817 includes a width of 1 mm to 1.4 mm. In an embodiment, each of the dimples 817 includes a width of 1 mm to 1.3 mm. In an embodiment, each of the dimples 817 includes a width of 1 mm to 1.2 mm. In an embodiment, each of the dimples 817 includes a width of 1 mm to 1.1 mm.

In an embodiment, each of the dimples 817 includes a width of 1.1 mm to 1.7 mm. In an embodiment, each of the dimples 817 includes a width of 1.1 mm to 1.6 mm. In an embodiment, each of the dimples 817 includes a width of 1.1 mm to 1.5 mm. In an embodiment, each of the dimples 817 includes a width of 1.1 mm to 1.4 mm. In an embodiment, each of the dimples 817 includes a width of 1.1 mm to 1.3 mm. In an embodiment, each of the dimples 817 includes a width of 1.1 mm to 1.2 mm. In an embodiment, each of the dimples 817 includes a width of 1.2 mm to 1.7 mm. In an embodiment, each of the dimples 817 includes a width of 1.2 mm to 1.6 mm. In an embodiment, each of the dimples 817 includes a width of 1.2 mm to 1.5 mm. In an embodiment, each of the dimples 817 includes a width of 1.2 mm to 1.4 mm. In an embodiment, each of the dimples 817 includes a width of 1.2 mm to 1.3 mm.

In an embodiment, each of the dimples 817 includes a width of 1.3 mm to 1.7 mm. In an embodiment, each of the dimples 817 includes a width of 1.3 mm to 1.6 mm. In an embodiment, each of the dimples 817 includes a width of 1.3 mm to 1.5 mm. In an embodiment, each of the dimples 817 includes a width of 1.3 mm to 1.4 mm. In an embodiment, each of the dimples 817 includes a width of 1.4 mm to 1.7 mm. In an embodiment, each of the dimples 817 includes a width of 1.4 mm to 1.6 mm. In an embodiment, each of the dimples 817 includes a width of 1.4 mm to 1.5 mm. In an embodiment, each of the dimples 817 includes a width of 1.5 mm to 1.7 mm. In an embodiment, each of the dimples 817 includes a width of 1.5 mm to 1.6 mm. In an embodiment, each of the dimples 817 includes a width of 1.6 mm to 1.7 mm.

In an embodiment, each of the dimples 817 includes a width of 1 mm. In an embodiment, each of the dimples 817 includes a width of 1.1 mm. In an embodiment, each of the dimples 817 includes a width of 1.2 mm. In an embodiment, each of the dimples 817 includes a width of 1.3 mm. In an embodiment, each of the dimples 817 includes a width of 1.37 mm. In an embodiment, each of the dimples 817 includes a width of 1.4 mm. In an embodiment, each of the dimples 817 includes a width of 1.5 mm. In an embodiment, each of the dimples 817 includes a width of 1.6 mm. In an embodiment, each of the dimples 817 includes a width of 1.7 mm.

In an embodiment, each of the dimples 817 includes a depth of 1 mm to 1.2 mm. In an embodiment, a majority of the dimples 817 have a depth of 1 mm to 1.2 mm. In an embodiment, each of the dimples 817 includes a depth of 1 mm to 1.15 mm. In an embodiment, each of the dimples 817 includes a depth of 1 mm to 1.1 mm. In an embodiment, each of the dimples 817 includes a depth of 1 mm to 1.05 mm. In an embodiment, each of the dimples 817 includes a depth of 1.05 mm to 1.2 mm. In an embodiment, each of the dimples 817 includes a depth of 1.05 mm to 1.15 mm. In an embodiment, each of the dimples 817 includes a depth of 1.05 mm to 1.1 mm. In an embodiment, each of the dimples 817 includes a depth of 1.1 mm to 1.2 mm. In an embodiment, each of the dimples 817 includes a depth of 1.1 mm to 1.15 mm. In an embodiment, each of the dimples 817 includes a depth of 1.15 mm to 1.2 mm.

In an embodiment, each of the dimples 817 includes a depth of 1 mm. In an embodiment, each of the dimples 817 includes a depth of 1.05 mm. In an embodiment, each of the dimples 817 includes a depth of 1.08 mm. In an embodiment, each of the dimples 817 includes a depth of 1.1 mm. In an embodiment, each of the dimples 817 includes a depth of 1.15 mm. In an embodiment, each of the dimples 817 includes a depth of 1.2 mm.

In an embodiment, the liner 816 includes polytetrafluoroethylene (PTFE). In an embodiment, the liner 816 includes PTFE coated glass fabric. In an embodiment, the PTFE coated glass fabric is Steinbach AG PTFE fabric 9004. In an embodiment, the liner 816 is configured to form within the frontsheet 803 a plurality of indentations having a size and shape corresponding to those of the plurality of dimples 817.

In another embodiment, the indentations are created by embossing a portion of the frontsheet 803. In another embodiment, the indentations are created by embossing the polymer layer 805 of the frontsheet 803.

Figure 11:
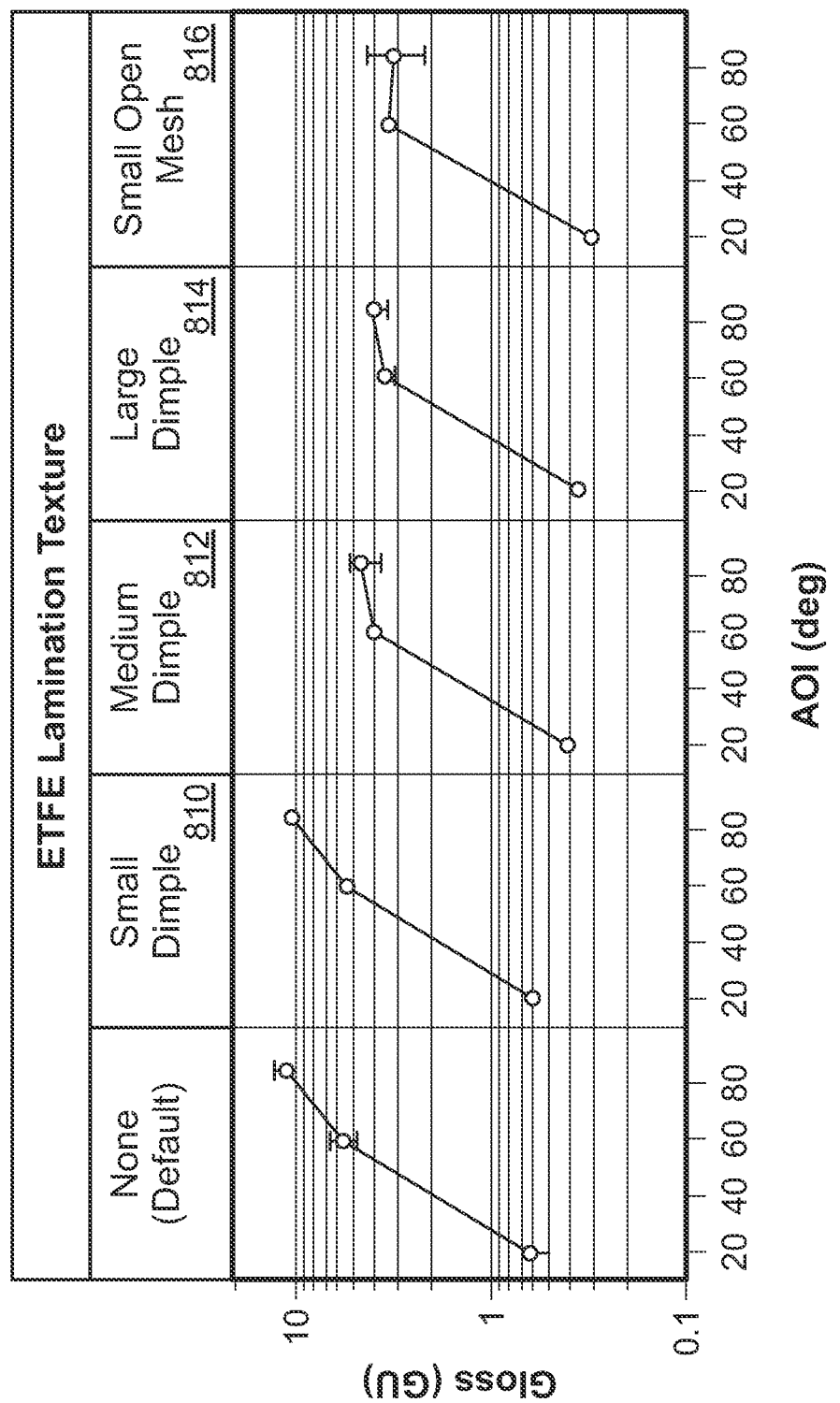
FIG. 11 shows a graph of angle of inclination (AOI) versus gloss of the textured release liners shown in FIGS. 10A through 10D.

FIG. 11 shows a graph of measurements of angle of incidence (AOI) in degrees versus gloss (GU) for each of the liners 810, 812, 814, 816. In an embodiment, the gloss (GU) increases at a steady rate from an angle of incidence of 20 degrees to 60 degrees. In an embodiment, the gloss (GU) increases at a steady but reduced rate from an angle of incidence of 60 degrees to 85 degrees for each of the liners 810, 812, 814. In an embodiment, for the liner 816, the gloss decreases from an angle of incidence of 60 degrees to 85 degrees.

In an embodiment, for the liner 810, the gloss increases from 0.6 GU to 6 GU from an angle of incidence of 20 degrees to 60 degrees, while the gloss increases from 6 GU to 10 GU from an angle of incidence of 60 degrees to 85 degrees.

In an embodiment, for the liner 812, the gloss increases from 0.6 GU to 6 GU from an angle of incidence of 20 degrees to 60 degrees, while the gloss increases from 6 GU to 10 GU from an angle of incidence of 60 degrees to 85 degrees.

In an embodiment, for the liner 814, the gloss increases from 0.4 GU to 1.3 GU from an angle of incidence of 20 degrees to 60 degrees, while the gloss increases from 1.3 GU to 1.4 GU from an angle of incidence of 60 degrees to 85 degrees.

In an embodiment, for the liner 814, the gloss increases from 0.4 GU to 1.25 GU from an angle of incidence of 20 degrees to 60 degrees, while the gloss increases from 1.25 GU to 1.3 GU from an angle of incidence of 60 degrees to 85 degrees.

In an embodiment, for the liner 816, the gloss increases from 0.3 GU to 1.3 GU from an angle of incidence of 20 degrees to 60 degrees, while the gloss decreases from 1.3 GU to 1.2 GU from an angle of incidence of 60 degrees to 85 degrees.

While a number of embodiments of the present invention have been described, it is understood that these embodiments are illustrative only, and not restrictive, and that many modifications may become apparent to those of ordinary skill in the art. Further still, the various steps may be carried out in any desired order (and any desired steps may be added and/or any desired steps may be eliminated).

What is claimed is:

1. A system, comprising:
    at least one solar module installed on a roof deck, wherein each of the at least one solar module includes:
    a superstrate layer having an upper surface and a lower surface opposite the upper surface,
    wherein the superstrate layer comprises a polymeric material,
    wherein the polymeric material comprises ethylene tetrafluoroethylene ("ETFE"), polyethylene terephthalate ("PET"), or combinations thereof;
    an encapsulant having an upper layer and a lower layer opposite the upper layer, wherein the upper layer is juxtaposed with the lower surface of the superstrate layer, wherein the upper layer includes a lower surface; and a photovoltaic layer intermediate the upper layer and the lower layer of the encapsulant, wherein the photovoltaic layer includes an upper surface, wherein the upper surface of the superstrate layer of a first one of the at least one solar module includes a first indentation pattern wherein the polymeric material of the superstrate layer includes the first indentation pattern, wherein the first indentation pattern includes a non-uniform mesh of indentations indented into the upper surface of the superstrate layer and a plurality of openings defined by the mesh of indentations, wherein a majority of the plurality of openings have a circle shape, wherein a majority of the plurality of openings have a surface area of 1 square millimeter to 20 square millimeters, wherein a depth of a measured one of the indentations of the first indentation pattern is measured from (a) the upper surface of the superstrate layer to (b) a point in the measured one of the indentations of the first indentation pattern that is closest to the lower surface of the superstrate layer, and is measured in a direction perpendicular to the upper surface of the superstrate layer, wherein a majority of the indentations of the first indentation pattern have a depth of 0.12 millimeter to 1.2 millimeter, wherein a thickness of the upper layer of the encapsulant at the measured one of the indentations of the first indentation pattern is measured from (a) the upper surface of the photovoltaic layer to (b) a point in the lower surface of the upper layer of the encapsulant at the measured one of the indentations of the first indentation pattern that is closest to the upper surface of the photovoltaic layer, and is measured in a direction perpendicular to the upper surface of the photovoltaic layer, wherein the thickness of the upper layer of the encapsulant is at least 100 microns, and wherein a transmission loss of power of light transmitted through the superstrate layer having the first indentation pattern is less than 2 percent as a compared to light transmitted through a comparison superstrate that is identical to the superstrate layer but lacks the first indentation pattern.

2. The system of claim 1, further comprising a substrate layer juxtaposed with the lower layer of the encapsulant.

3. The system of claim 1, wherein the system comprises at least the first one of the at least one solar module and a second one of the at least one solar module, wherein the second one of the at least one solar module is disposed adjacent to the first one of the at least one solar module, wherein the upper surface of the superstrate layer of the second one of the at leastone solar module includes a second indentation pattern, and wherein the second indentation pattern is different from the first indentation pattern.

4. The system of claim 1, wherein a majority of the indentationsof the first indentation pattern have the depth of 0.5 millimeter to 0.75 millimeter.

5. The system of claim 1, wherein a minimum thickness of the upper encapsulant layer is 100 microns to 450 microns.

6. The system of claim 1, wherein the photovoltaic layer includes a plurality of photovoltaic elements and an encapsulant region located between a first one of the plurality of photovoltaic elements and a second one of the plurality of photovoltaic elements that is adjacent to the first one of the plurality of photovoltaic elements, and wherein the encapsulant region is filled with an encapsulant material of the encapsulant.

7. A system, comprising:

at least one solar module installed on a roof deck, wherein each of the at least one solar module includes:

a superstrate layer having an upper surface and a lower surface opposite the upper surface, wherein the superstrate layer comprises a polymeric material, wherein the polymeric material comprises ethylene tetrafluoroethylene ("ETFE"), polyethylene terephthalate ("PET"), or combinations thereof;

an encapsulant having an upper layer and a lower layer opposite the upper layer, wherein the upper layer is juxtaposed with the lower surface of the superstrate layer, wherein the upper layer includes a lower surface; and a photovoltaic layer intermediate the upper layer and the lower layer of the encapsulant, wherein the photovoltaic layer includes an upper surface, wherein the upper surface of the superstrate layer of a first one of the at least one solar module includes a first indentation pattern, wherein the polymeric material of the superstrate layer includes the first indentation pattern, wherein the first indentation pattern includes a mesh of indentations indented into the upper surface of the superstrate layer and a plurality of openings defined by the mesh of indentations, wherein a majority of the plurality of openings have a surface area of 1 square millimeter to 20 square millimeters, wherein a depth of a measured one of the indentations of the first indentation pattern is measured from (a) the upper surface of the superstrate layer to (b) a point in the measured one of the indentations of the first indentation pattern that is closest to the lower surface of the superstrate layer, and is measured in a direction perpendicular to the upper surface of the superstrate layer, wherein a majority of the indentations of the first indentation pattern have a depth of 0.12 millimeter to 1.2 millimeter, wherein a thickness of the upper layer of the encapsulant at the measured one of the indentations of the first indentation pattern is measured from (a) the upper surface of the photovoltaic layer to (b) a point in the lower surface of the upper layer of the encapsulant at the measured one of the indentations of the first indentation pattern that is closest to the upper surface of the photovoltaic layer, and is measured in a direction perpendicular to the upper surface of the photovoltaic layer, wherein the thickness of the upper layer of the encapsulant is at least 100 microns, and wherein a transmission loss of power of light transmitted through the superstrate layer having the first indentation pattern is less than 2 percent as a compared to light transmitted through a comparison superstrate that is identical to the superstrate layer but lacks the first indentation pattern.

* * * * *